(12) United States Patent
Kim et al.

(10) Patent No.: US 10,340,297 B2
(45) Date of Patent: Jul. 2, 2019

(54) DISPLAY DEVICE

(71) Applicant: Samsung Display Co., Ltd., Yongin-si (KR)

(72) Inventors: Kwihyun Kim, Yongin-si (KR); Yoon-jang Kim, Seoul (KR); Sungryul Kim, Asan-si (KR); Yunseok Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 240 days.

(21) Appl. No.: 15/485,194

(22) Filed: Apr. 11, 2017

(65) Prior Publication Data

US 2017/0301702 A1    Oct. 19, 2017

(30) Foreign Application Priority Data

Apr. 15, 2016  (KR) .................. 10-2016-0045912

(51) Int. Cl.
| | | |
|---|---|---|
| *H01L 27/12* | (2006.01) | |
| *G09G 3/36* | (2006.01) | |
| *H01L 29/786* | (2006.01) | |
| *H01L 29/417* | (2006.01) | |

(52) U.S. Cl.
CPC ....... *H01L 27/1251* (2013.01); *G09G 3/3677* (2013.01); *G09G 3/3688* (2013.01); *H01L 27/124* (2013.01); *H01L 27/1255* (2013.01); *H01L 29/41733* (2013.01); *H01L 29/78696* (2013.01); *G09G 3/3648* (2013.01); *G09G 2300/0426* (2013.01); *G09G 2320/0219* (2013.01); *G09G 2320/0223* (2013.01)

(58) Field of Classification Search
None
See application file for complete search history.

(56) References Cited

U.S. PATENT DOCUMENTS

| | | | |
|---|---|---|---|
| 7,916,231 B2 | 3/2011 | Ooida et al. | |
| 2006/0187171 A1* | 8/2006 | Kawata | G09G 3/3648 345/98 |
| 2008/0068326 A1* | 3/2008 | Chen | G09G 3/3677 345/100 |
| 2015/0235599 A1 | 8/2015 | Cho et al. | |

FOREIGN PATENT DOCUMENTS

| | | |
|---|---|---|
| KR | 10-0426132 | 4/2004 |
| KR | 10-2008-0110124 | 12/2008 |
| KR | 10-2015-0097857 | 8/2015 |

* cited by examiner

*Primary Examiner* — Duane N Taylor, Jr.
(74) *Attorney, Agent, or Firm* — H.C. Park & Associates, PLC

(57) ABSTRACT

Deterioration of image quality in a display device due to kickback voltages may be reduced or prevented by varying parasite capacitance, the size of the semiconductor layer, and/or storage capacitance in each of thin film transistors for the pixels in the display. Various embodiments of display devices capable of reducing or preventing kickback voltages are disclosed.

20 Claims, 14 Drawing Sheets

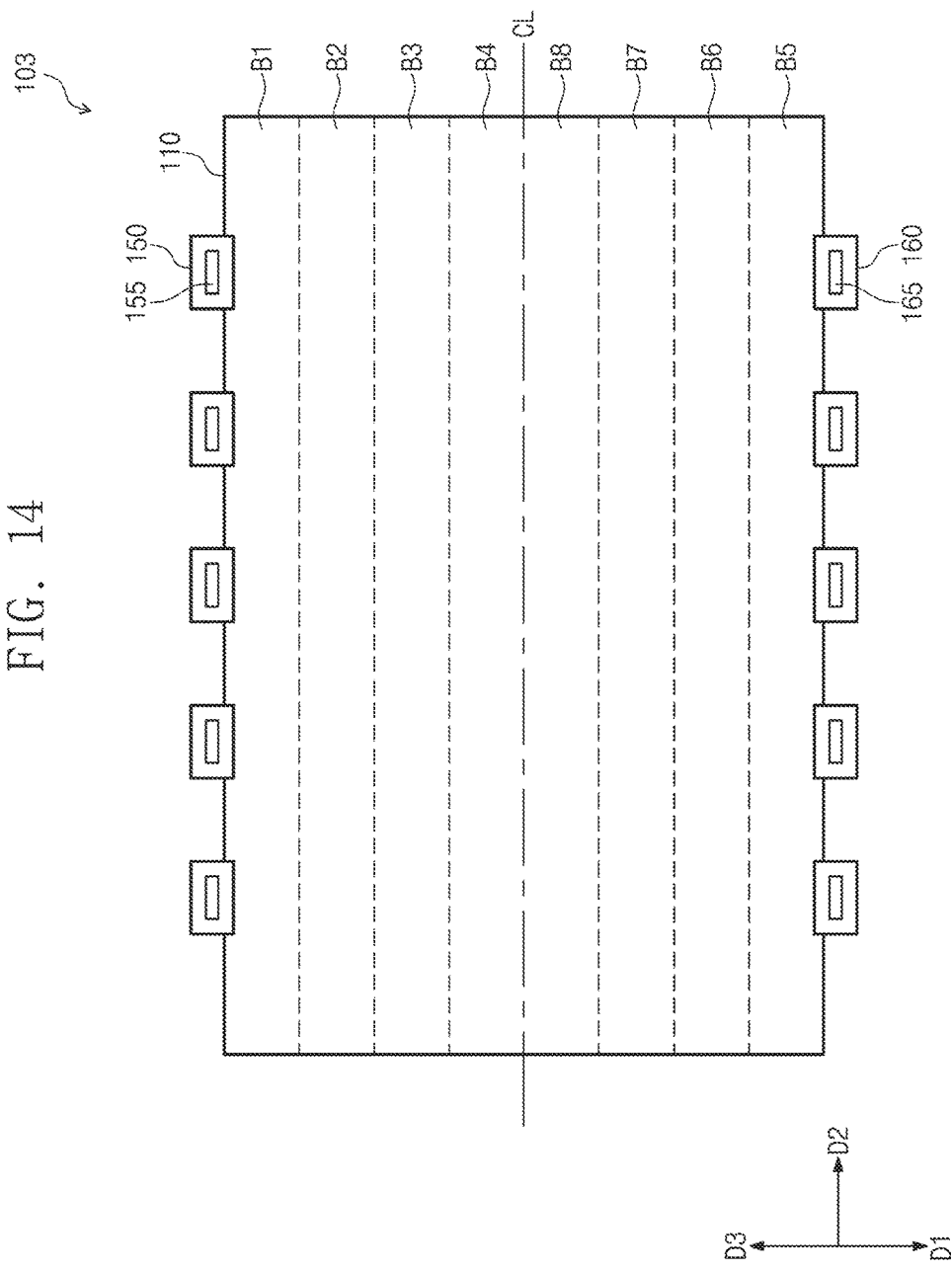

DISPLAY DEVICE

CROSS-REFERENCE TO RELATED APPLICATION

This application claims priority from and the benefit of Korean Patent Application No. 10-2016-0045912, filed on Apr. 15, 2016, which is hereby incorporated by reference for all purposes as if fully set forth herein.

BACKGROUND

Field

The invention relates generally to display devices, and more particularly, to a display device having improved image quality.

Discussion of the Background

In general, a liquid crystal display device includes two display substrates where a pixel electrode and a common electrode are formed and a liquid crystal layer interposed therebetween. Voltage is applied to the pixel electrode and the common electrode to generate an electric field therebetween, which determined, the orientation of liquid crystal molecules in the liquid crystal layer and controls the polarization of incident light, thereby displaying an image.

A liquid crystal display device includes a plurality of thin film transistors, and a plurality of gate lines and data lines intersecting each other are formed on a display substrate of the liquid crystal display device. A pixel corresponding to a unit for displaying an image includes at least one thin film transistor.

In the liquid crystal display device, a data signal is supplied to one end of the data line and delivered to the other end. The pixels receive the data signal via the data line through respective thin film transistors. Therefore, although the data signal having a desired signal voltage is supplied to pixels adjacent to one end of the data line, pixels which are far away from the one end of the data line may be charged with less than a target voltage due to a resistance-capacitance delay (RC delay) of the data line.

The above information disclosed in this Background section is only for enhancement of understanding of the background of the inventive concepts, and, therefore, it may contain information that does not form the prior art that is already known in this country to a person of ordinary skill in the art.

SUMMARY

Display devices constructed according to the principles of the invention include pixels capable of providing better image quality by reducing charging rate deviations and kickback voltage deviations in display panels.

For example, Applicants have discovered that to reduce or prevent pixels from having kickback voltage deviations caused by variable distances from a voltage source, the parasite capacitance of the thin film transistors, the size of the semiconductor layer, and/or the storage capacitance for each pixel may be varied to avoid image quality deterioration.

Additional aspects will be set forth in the detailed description which follows, and, in part, will be apparent from the disclosure, or may be learned by practice of the inventive concepts.

According to one aspect of the invention, a display device includes: a display panel including a plurality of data lines extending in a first direction, a plurality of gate lines extending in a second direction intersecting the first direction, and a plurality of thin film transistors connected to the plurality of data lines and the plurality of gate lines, each of the thin film transistors having a channel width; a data driving circuit configured to supply a data signal to the plurality of data lines; and a gate driving circuit configured to supply a gate signal to the plurality of gate lines. The channel width of each of the thin film transistors connected to the same data line increases as the distance between a corresponding thin film transistor and the data driving circuit increases. Each of the plurality of thin film transistors has a gate electrode, a source electrode, a drain electrode and a parasite capacitance generated between the gate electrode and the drain electrode. The parasite capacitance between the gate electrode and the drain electrode of each of the thin film transistors connected to the same data line decreases as the distance between a corresponding thin film transistor and the data driving circuit increases.

The channel width of each of the thin film transistors connected to the same data line may increase as an overlapping area of the source electrode and the gate electrode increases.

The parasite capacitance between the gate electrode and the drain electrode of each of the thin film transistors connected to the same data line may decrease as an overlapping area of the gate electrode and the drain electrode decreases.

The drain electrode may include a main body part spaced from the source electrode to define a channel area, and an auxiliary part extending from the main body part and located outside the channel area to vary the parasite capacitance.

The channel area may have a U-shape.

A channel area defined where the source electrode and the drain electrode are spaced from each other may have an I-shape.

The drain electrode may have a main body part spaced from the source electrode to define the channel area, and an auxiliary part extending from the main body part and located outside the channel area to vary the parasite capacitance.

The channel width may increase as an overlapping area of the main body part of the drain electrode and the gate electrode increases, and the parasite capacitance between the gate electrode and the drain electrode may decrease as an overlapping area of the gate electrode and the auxiliary part decreases.

The display panel may be divided into a plurality of blocks in the first direction, the channel width may increase by a unit of the blocks, and the channel width may be constant in the same block.

The difference in channel widths between the blocks may be determined by the number of the blocks.

According to another aspect of the invention, a display device includes: a display panel including a plurality of data lines extending in a first direction, a plurality of gate lines extending in a second direction intersecting the first direction, a plurality of thin film transistors connected to the plurality of data lines and the plurality of gate lines, each of the thin film transistors having a channel width, and a plurality of pixel electrodes respectively connected to the plurality of thin film transistors; a data driving circuit configured to supply a data signal to the plurality of data lines; and a gate driving circuit configured to supply a gate signal to the plurality of gate lines. The channel width of each of the thin film transistors increases as a distance between the corresponding thin film transistor and the data driving circuit increases. Each of the plurality of thin film transistors has a gate electrode, a source electrode, and a drain electrode. The display panel further includes a storage electrode configured to form a storage capacitance where it overlaps the drain electrode. The storage capacitance of each storage electrode increases as the distance between a corresponding thin film transistor and the data driving circuit increases.

The drain electrode may include a main body part spaced from the source electrode to define a channel area, and a contact part electrically contacting the pixel electrode and overlapping the storage electrode. The storage capacitance may be determined by the amount of area overlapping the contact part and the storage electrode.

The channel area may have a U-shape, and the channel width may increase as the amount of area overlapping the source electrode and the gate electrode increases.

The channel area may have an I-shape.

The channel width may increase as the amount of area overlapping the source electrode and the gate electrode increases.

The channel width may increase as the amount of area overlapping the drain electrode and the gate electrode increases.

According to yet another aspect of the invention, a display device includes: a display panel including a plurality of data lines extending in a first direction, a plurality of gate lines extending in a second direction intersecting the first direction, a plurality of thin film transistors connected to the plurality of data lines and the plurality of gate lines, each of the thin film transistors having a channel width, and a plurality of pixel electrodes respectively connected to the plurality of thin film transistors; a data driving circuit configured to supply a data signal to the plurality of data lines; and a gate driving circuit configured to supply a gate signal to the plurality of gate lines. The channel width of each of thin film transistors connected to the same data line of the plurality of thin film transistors increases as the distance between a corresponding thin film transistor and the data driving circuit increases. Each of the plurality of thin film transistors has a gate electrode, a semiconductor layer, a source electrode, and a drain electrode. The channel width is determined by the size of the semiconductor layer.

A channel area defined where the source electrode and the drain electrode are spaced apart from each other may have an I-shape.

The source electrode and the drain electrode may be spaced apart from the gate electrode with a semiconductor layer therebetween, and the channel width may increase as the area of the semiconductor layer increases.

The area of the gate electrode overlapping the drain electrode in each thin film transistor may be substantially the same, and the area of the gate electrode overlapping the source electrode in each thin film transistor may be substantially the same.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 14 is a plan view of yet another embodiment of a display device constructed according to the principles of the invention illustrating the display panel being divided into blocks disposed about a common line.

DETAILED DESCRIPTION OF THE ILLUSTRATED EMBODIMENTS

Figure 1:
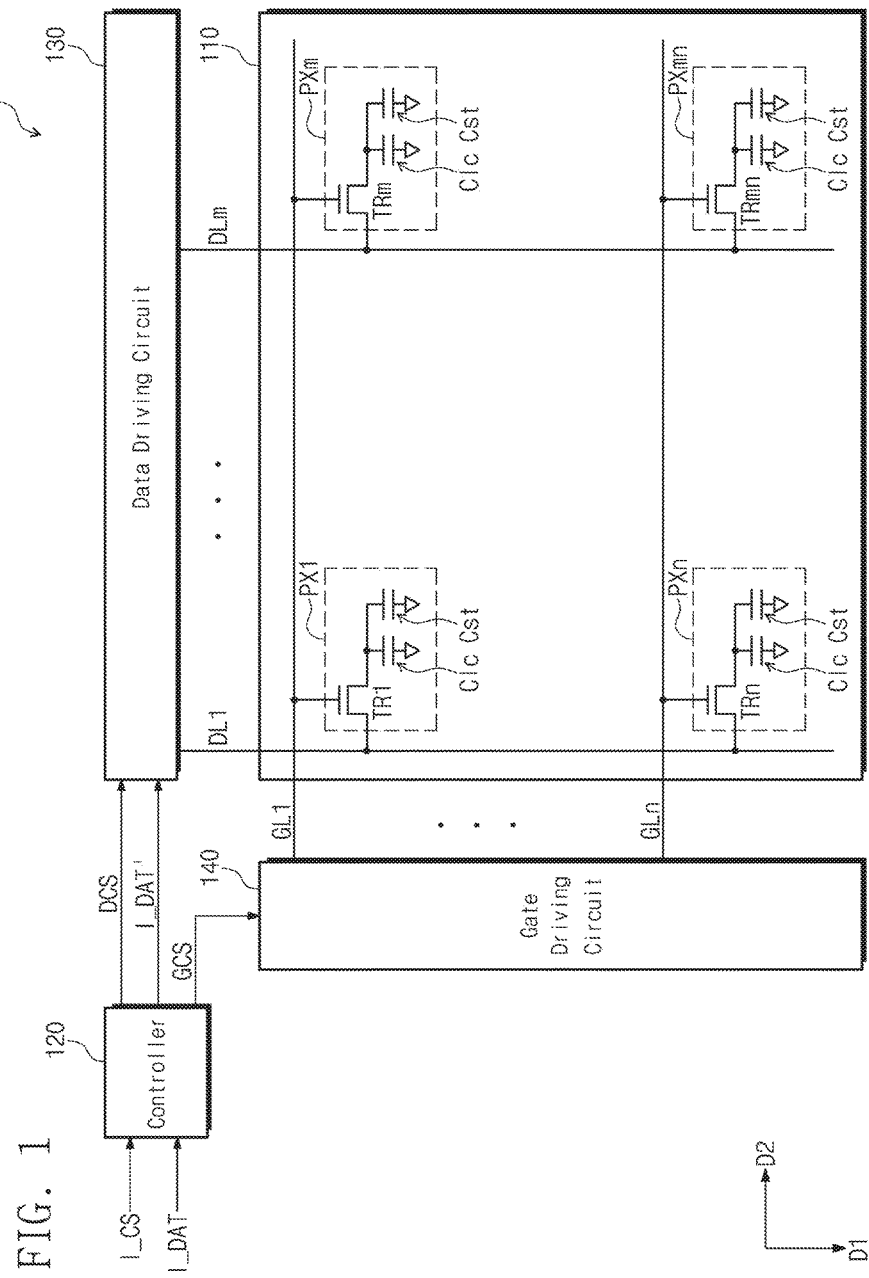
FIG. 1 is a plan view of a first embodiment of display device constructed according to the principles of the invention illustrating the size of the drain electrodes of the pixels decreasing along a data line.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a plan view of a first embodiment of a display device constructed according to the principles of the invention illustrating the size of the drain electrodes of the pixels decreasing along a data line.

Referring to FIG. 1, a display device 101 includes a display panel 110, a controller 120, a data driving circuit 130, and a gate driving circuit 140.

The display panel 110 includes a plurality of data lines DL1 to DLm, a plurality of gate lines GL1 to GLn, and a plurality of thin film transistors TR1 to TRmn.

The plurality of data lines DL1 to DLm extend in a first direction D1 and the plurality of gate lines GL1 to GLn extend in a second direction D2 intersecting the first direction D1. The plurality of thin film transistors TR1 to TRmn are connected to the plurality of data lines DL1 to DLm and the plurality of gate lines GL1 to GLn. In one or more exemplary embodiments, when the plurality of data lines DL1 to DLm are provided in m columns and the plurality of gate lines GL1 to GLn are provided in n rows, the thin film transistors TR1 to TRmn are arranged in a m*n matrix.

When a unit for displaying image information is defined as a pixel in the display panel 110, the display panel 110 includes pixels PX1 to PXmn. The plurality of pixels PX1 to PXmn may include the plurality of thin film transistors TR1 to TRmn, respectively, and each of the plurality of pixels PX1 to PXmn may include a liquid crystal capacitance Clc connected to the corresponding thin film transistor. The liquid crystal capacitance Clc may represent the capacitance of a portion of the liquid crystal layer which corresponds to each pixel. Each of the plurality of pixels PX1 to PXmn may further include a storage capacitance Cst connected in parallel to the liquid crystal capacitance Clc.

Although not shown in the drawing, the display panel 110 may further include a color filter to allow each of the plurality of pixels PX to have one of red, green, blue, and white colors.

The controller 120 receives input image data I_DAT and an image control signal I_CS from an external image board (not shown). The input image data I_DAT may be defined as an image data signal inputted from the outside of the display device 101 to the display device 101.

The controller 120 generates a gate control signal GCS and a data control signal DCS in response to the image control signal I_CS and converts the format of the input image data I_DAT to generate converted image data I_DAT'. The gate driving circuit 140 receives the gate control signal GCS from the controller 120 and generates a gate signal in response to the gate control signal GCS to output the generated gate signal to the display panel 110. The data driving circuit 130 receives the converted image data I_DAT' and the data control signal DCS from the controller 120, and converts the converted image data I_DAT' into a data signal to output the data signal to the display panel 110 in response to the data control signal DCS.

The plurality of gate lines GL1 to GLn of the display panel 110 is connected to the gate driving circuit 140 to receive the gate signal and the plurality of data lines DL1 to DLm receive the data signals from the data driving circuit 130. Each of the plurality of pixels PX11 to PXnm in the display panel 110 is connected to a corresponding gate line of the plurality of gate lines GL1 to GLn and a corresponding data line of the plurality of data lines DL1 to DLm. Accordingly, each of the plurality of pixels PX11 to PXnm may display an image according to the gate and data signals applied to the pixels.

Figure 2:
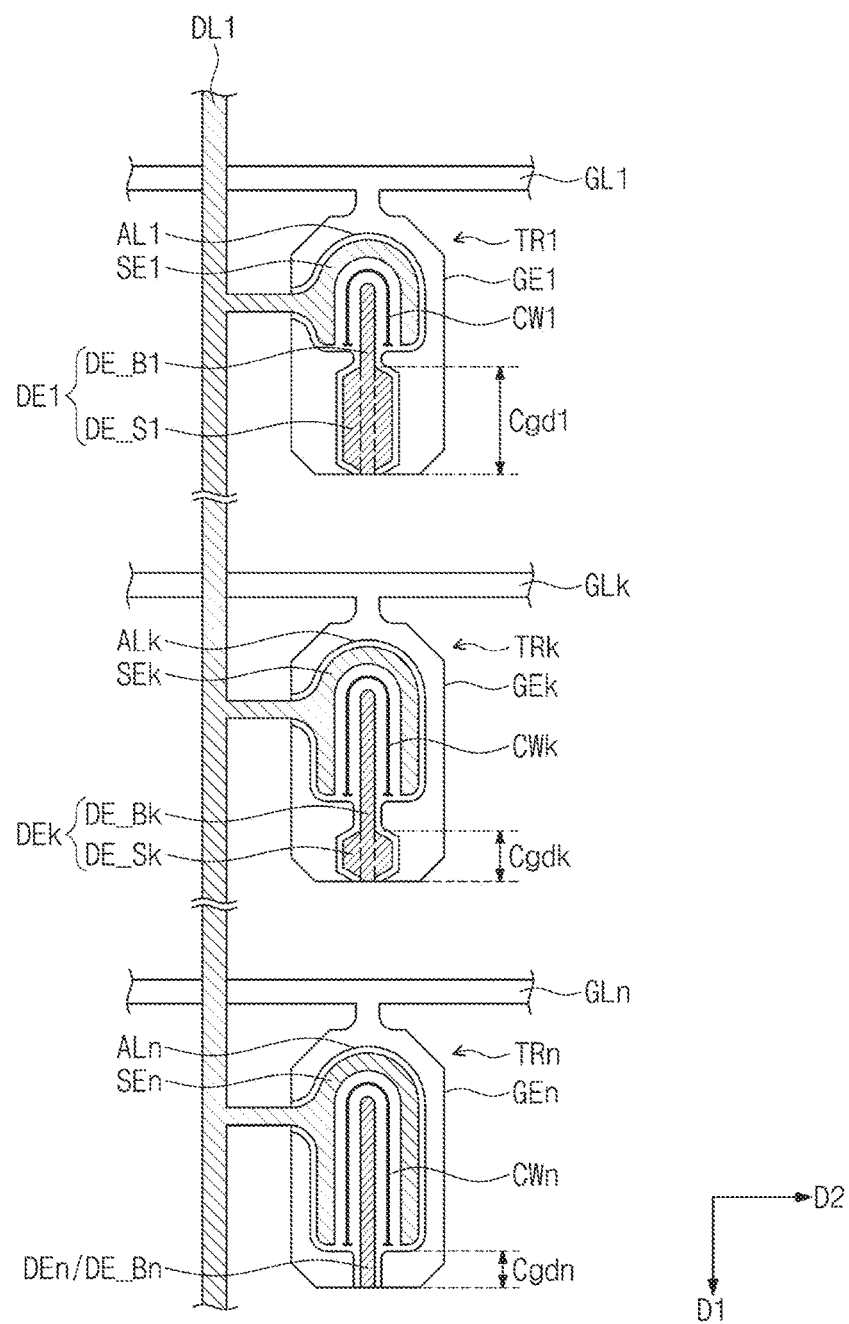
FIG. 2 is a plan view illustrating thin film transistors connected to a first data line shown in FIG. 1.

FIG. 2 is a plan view illustrating thin film transistors connected to a first data line shown in FIG. 1.

FIG. 2 illustrates thin film transistors TR1 to TRn connected to a first data line DL1 of the plurality of data lines DL1 to DLm shown in FIG. 1, and the structures of thin film transistors connected to the remaining data lines DL2 to DLm are similar thereto. Therefore, descriptions of these components will be omitted to avoid redundancy.

Referring to FIG. 2, the plurality of thin film transistors TR1 to TRn are connected to the first data line DL1 along the first direction D1. Of the plurality of thin film transistors TR1 to TRn, FIG. 2 illustrates only three thin film transistors TR1, TRk, and TRn connected to a first gate line GL1, a kth gate line GLk, and an nth gate line GLn, respectively. Hereinafter, the three thin film transistors are referred to as first, kth, and nth thin film transistors TR1, TRk, and TRn.

The first thin film transistor TR1 of the first, kth, and nth thin film transistors TR1, TRk, and TRn is disposed closest to the data driving circuit 130. Proceeding progressively in the first direction D1 from the top of FIG. 2 towards the bottom, the distance from the data driving circuit 130 increases. Therefore, the nth thin film transistor TRn is disposed at the farthest position from the data driving circuit 130. As the distance from the data driving circuit 130 increases, the delay rate of the data signal increases. In order to compensate for the delay of the data signal, the channel width of each of the plurality of thin film transistors TR1 to TRn connected to the first data line DL1 increases as the distance from the data driving circuit 130 increases.

For example, of the plurality of thin film transistors TR1 to TRn connected to the first data line DL1, the first thin film transistor TR1 has the smallest first channel width CH1; the kth thin film transistor TRk has a second channel width CH2 greater than the first channel width; and the nth thin film transistor TRn has a third channel width CH3 greater than the second channel width CH2.

The first thin film transistor TR1 includes a first gate electrode GE1, a first source electrode SE1, a first drain electrode DE1, and a first semiconductor layer AL1. The first gate electrode GE1 is branched from the first gate line GL1 and the first semiconductor layer AL1 is disposed on the first gate electrode GE1. The first source electrode SE1 is branched from the first data line DL1 and is disposed on the first gate electrode GE1 and the first drain electrode DE1 is disposed spaced apart from the first source electrode SE1 on the first gate electrode GE1. The first source electrode SE1 and the first drain electrode DE1 face the first gate electrode GE1 with the first semiconductor layer AL1 therebetween.

The first source electrode SE1 and the first drain electrode DE1 face each other and form a first channel area. The first channel area has a predetermined length and has the first channel width CW1.

In FIG. 2, the first channel area has a U-shape view in plan. Additionally, the first channel width CW1 is determined by the length that the first source electrode SE1 and the first drain electrode DE face each other and as the size of the first source electrode SE1 increases, the first channel width CW1 increases. In this embodiment, "the size of the first source electrode SE1 increases" may mean that an overlapping area of the first source electrode SE1 and the first gate electrode GE1 increases.

The first drain electrode DE1 includes a first body part DE_B1 and a first auxiliary part DE_S1. The first body part DE_B1 is a part for forming the first channel area, as facing the first source electrode SE1. The first auxiliary part DE_S1 extends from the first body part DE_B1 to increase a first parasitic capacitance Cgd1 between the first gate electrode GE1 and the first drain electrode DE1.

Next, the kth thin film transistor TRk includes a kth gate electrode GEk, a kth source electrode SEk, a kth drain electrode DEk, and a kth semiconductor layer ALk. The kth gate electrode GEk is branched from the kth gate line GLk and the kth semiconductor layer ALk is disposed on the kth gate electrode GEk. The kth source electrode SEk is branched from the first data line DL1 and is disposed on the kth gate electrode GEk and the kth drain electrode DEk is disposed spaced apart from the kth source electrode SEk on the kth gate electrode GEk. The kth source electrode SEk and the kth drain electrode DEk face the kth gate electrode GEk with the kth semiconductor layer ALk therebetween.

The kth source electrode SEk and the kth drain electrode DEk face each other and form a kth channel area. The length of the kth channel area is identical to the length of the first channel area and the kth channel area has a kth channel width CWk greater than the first channel width CW1.

The size of the kth source electrode SEk is greater than the size of the first source electrode SE1 so that the kth channel width CWk may be greater than the first channel width CW1. Herein, the overlapping area of the kth source electrode SEk and the kth gate electrode GEk is greater than the overlapping area of the first source electrode SE1 and the first gate electrode GE1.

The kth drain electrode DEk includes a kth body part DE_Bk and a kth auxiliary part DE_Sk. The kth body part DE_Bk is a part for forming the kth channel area, as facing the kth source electrode SEk. The kth auxiliary part DE_Sk is added to increase a kth parasitic capacitance Cgdk between the kth drain electrode DEk and the kth gate electrode GEk. According to this embodiment, the kth auxiliary part DE_Sk has a smaller area then the first auxiliary part DE_S1. Accordingly, the kth parasitic capacitance Cgdk is smaller than the first parasitic capacitance Cgd1.

Lastly, the nth thin film transistor TRn includes an nth gate electrode GEn, an nth source electrode SEn, an nth drain electrode DEn, and an nth semiconductor layer ALn. The nth gate electrode GEn is branched from the nth gate line GLn and the nth semiconductor layer ALn is disposed on the nth gate electrode GEn. The nth source electrode SEn is branched from the first data line DL1 and is disposed on the nth gate electrode GEn and the nth drain electrode DEn is disposed spaced apart from the nth source electrode SEn on the nth gate electrode GEn. The nth source electrode SEn and the nth drain electrode DEn face the nth gate electrode GEn with the nth semiconductor layer ALn therebetween.

The nth source electrode SEn and the nth drain electrode DEn face each other and form an nth channel area. The length of the nth channel area is identical to the lengths of the first and kth channel area and the nth channel area has a third channel width CWn greater than the kth channel width CWk.

The nth channel width CWn may be greater than the kth channel width CWk as the size of the nth source electrode SEn increases over the size of the kth source electrode SEk. Herein, the overlapping area of the nth source electrode SEn and the nth gate electrode GEk is greater than the overlapping area of the kth source electrode SEk and the kth gate electrode GEk.

The nth drain electrode DEn includes an nth body part DE_Bn and does not include an auxiliary part additionally. When the sizes of the first, kth, and nth body parts DE_B1, DE_Bk, and DE_Bn are the same, an nth parasite capacitance Cgdn between the nth drain electrode DEn and the nth gate electrode GEn is smaller than the first and kth parasite capacitances Cgd1 and Cgdk.

In sum, each channel width of the plurality of thin film transistors TR1 to TRn may increase as each overlapping area of a source electrode and a gate electrode increases. Additionally, the parasite capacitance between the gate electrode and the drain electrode of each of the plurality of thin film transistors TR1 to TRn may decrease as the overlapping area of the gate electrode and the drain electrode decreases.

Herein, the parasite capacitance between the source electrode and the gate electrode is defined as Cgs and the parasite capacitance between the drain electrode and the gate electrode is defined as Cgd. If each channel width of the plurality of thin film transistors TR1 to TRn is increased as a method of increasing the size of the source electrode, the Cgs of the plurality of thin film transistors TR1 to TRn increases. That is, since the plurality of thin film transistors TR1 to TRn have different channel widths, a difference in Cgs occurs between the plurality of thin film transistors TR1 to TRn. The difference in Cgs may cause each pixel to have a deviation of a kickback voltage Vkb.

The parasite capacitance Cgs between the source electrode and the gate electrode may drop the data signal when the gate signal changes from a high voltage to a low voltage. The dropped data signal refers to a voltage difference between an inputted data signal and a pixel voltage for charging a pixel and herein, the voltage difference may vary the kickback voltage Vkb. Furthermore, the parasite capacitance Cgd between the drain electrode and the gate electrode may drop the voltage being charged at the pixel, such as the drain electrode, when the gate signal changes from the high voltage to the low voltage. The voltage difference between a target voltage and the charged voltage may also change the kickback voltage Vkb.

The kickback voltage Vkb satisfies the following Equation 1.

$$Vkb = \frac{Cgd(Cgs)}{Cgd(Cgs) + Clc + Cst} \Delta Vg \quad \text{[Equation 1]}$$

where ΔVg represents a difference of a high voltage and a high voltage of the gate signal.

According to Equation 1, a difference in the parasite capacitance Cgs in each of the plurality of thin film transistors TR1 to TRn causes a deviation of the kickback voltage Vkb for each pixel. According to the principles of the invention, the parasite capacitance Cgd is varied for each pixel. By adjusting the size of the auxiliary part formed at the drain electrode of each thin film transistor, the parasite capacitance Cgd between the drain electrode and the gate electrode may be reduced as the distance from the data driving circuit 130 increases.

Accordingly, in order to prevent a deviation in the channel width of each of the plurality of thin film transistors TR1 to TRn from appearing as a deviation in the kickback voltage Vkb, the parasite capacitance Cgd for each of the plurality of thin film transistors TR1 to TRn may vary. Thereby, deterioration in image quality due to the deviation of the kickback voltage Vkb may be reduced or prevented.

Figure 3A:
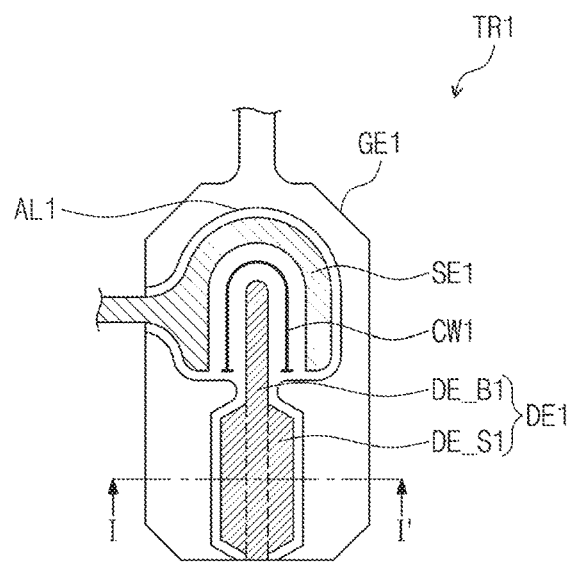
FIG. 3A is an enlarged view of a first thin film transistor of FIG. 2.
Figure 3B:
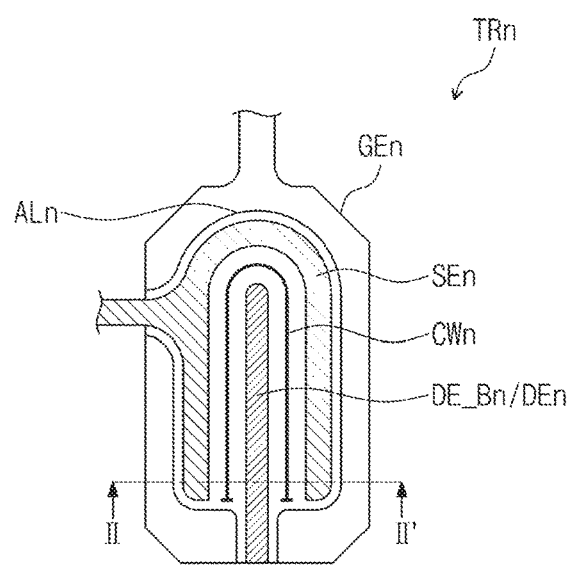
FIG. 3B is an enlarged view of an nth thin film transistor of FIG. 2.
Figure 4A:
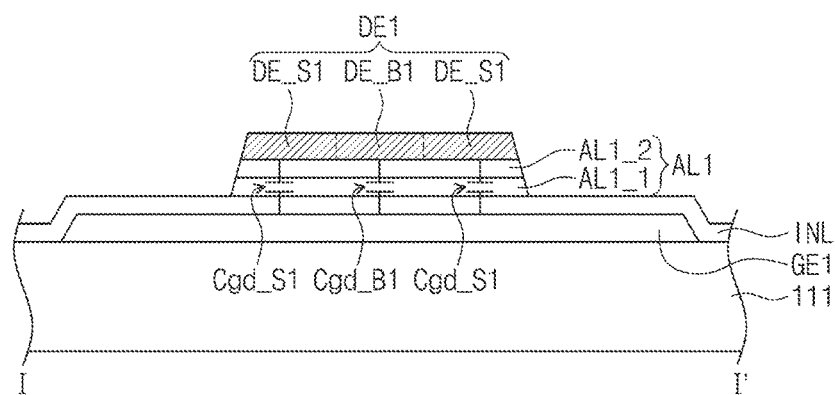
FIG. 4A is a cross-sectional view taken along line I-I' shown in FIG. 3A.
Figure 4B:
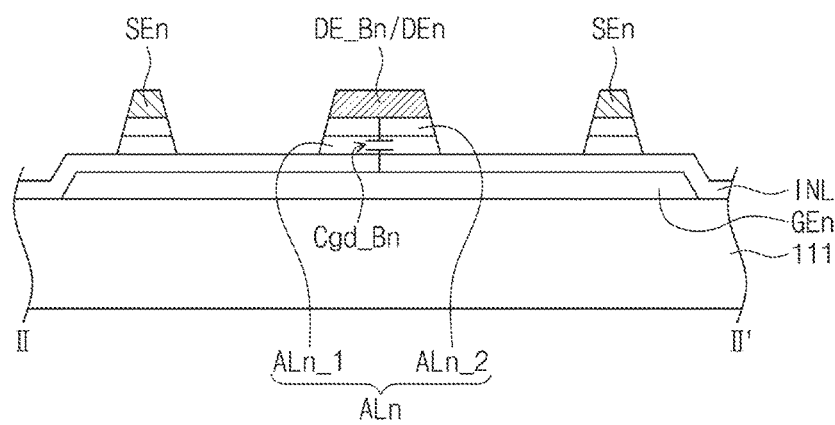
FIG. 4B is a cross-sectional view taken along line II-II' of FIG. 3B.

FIG. 3A is an enlarged view of a first thin film transistor of FIG. 2. FIG. 3B is an enlarged view of an nth thin film transistor of FIG. 2. FIG. 4A is a cross-sectional view taken along line I-I' shown in FIG. 3A and FIG. 4B is a cross-sectional view taken along line II-II' of FIG. 3B.

Referring to FIGS. 3A and 4A, the display panel 110 includes a base substrate 111 and the first gate electrode GE1 is provided on the base substrate 111. Thereon, a gate insulation layer INL for covering the first gate electrode GE1 is formed. The first semiconductor layer AL1 is formed on the gate insulation layer INL and the first source electrode DE1 and the first drain electrode DE1 are formed on the first semiconductor layer AL1. As one example, the first semiconductor layer AL1 may include a first active layer AL1_1 and a first ohmic contact layer AL1_2.

The first source electrode SE1 may have a U shape in plan and the first body part DE_B1 of the first drain electrode DE1 has an elongate bar form extending between the end portions of the U-shaped first source electrode SE1. Accordingly, a first channel area has a channel width CW1 is formed between the first drain electrode DE1 and the first source electrode SE1.

The first drain electrode DE1 includes the first auxiliary part DE_S1 overlapping the first gate electrode GE1 and extending from the first body part DE_B1. When it is assumed that the parasite capacitance between the first body part DE_B1 and the first gate electrode GE1 is Cgd_B1 and the parasite capacitance between the first auxiliary part DE_S1 and the first gate electrode GE1 is Cgd_S1, the first parasite capacitance Cgd1 shown in FIG. 2 between the first drain electrode DE1 and the first gate electrode GE1 is defined as the sum of Cgd_B1 and Cgd_S1.

Referring to FIGS. 3B and 4B, the nth gate electrode GEn is provided on the base substrate 111 and thereon, the gate insulation layer INL for covering the nth gate electrode GEn is formed. The nth semiconductor layer ALn is formed on the gate insulation layer INL and the nth source electrode SEn and the nth drain electrode DEn are formed on the nth semiconductor layer ALn. The nth source electrode SEn may also have a U shape and the nth body part DE_Bn of the nth drain electrode DEn has an elongate bar form extending between the end portions of the U-shaped nth source electrode SEn. Accordingly, an nth channel area is formed between the nth drain electrode DEn and the nth source electrode SEn.

The nth source electrode SEn has a greater size than the first source electrode SE1. Accordingly, the nth channel width CWn of the nth thin film transistor TRn is wider than the first channel width CW1 of the first thin film transistor TR1.

Moreover, the nth drain electrode DEn includes only an nth body part DE_Bn having the same size as the first body part DE_B1. Accordingly, an nth parasite capacitance Cgdn shown in FIG. 2 between the nth drain electrode DEn and the nth gate electrode GEn is defined as the parasite capacitance Cgd_Bn between the nth body part DE_Bn and the nth gate electrode GEn. Since Cgd_B1 and Cgd_Bn are the same substantially, the first parasite capacitance Cgd1 has a larger value than the nth parasite capacitance Cgdn by Cgd_S1.

Therefore, the deviation of the kickback voltage Vkb resulting from the difference between the size of the first source electrode SE1 and the size of the nth source electrode SEn increases, may be compensated for by the parasite capacitance Cgd_S1.

Figure 5:
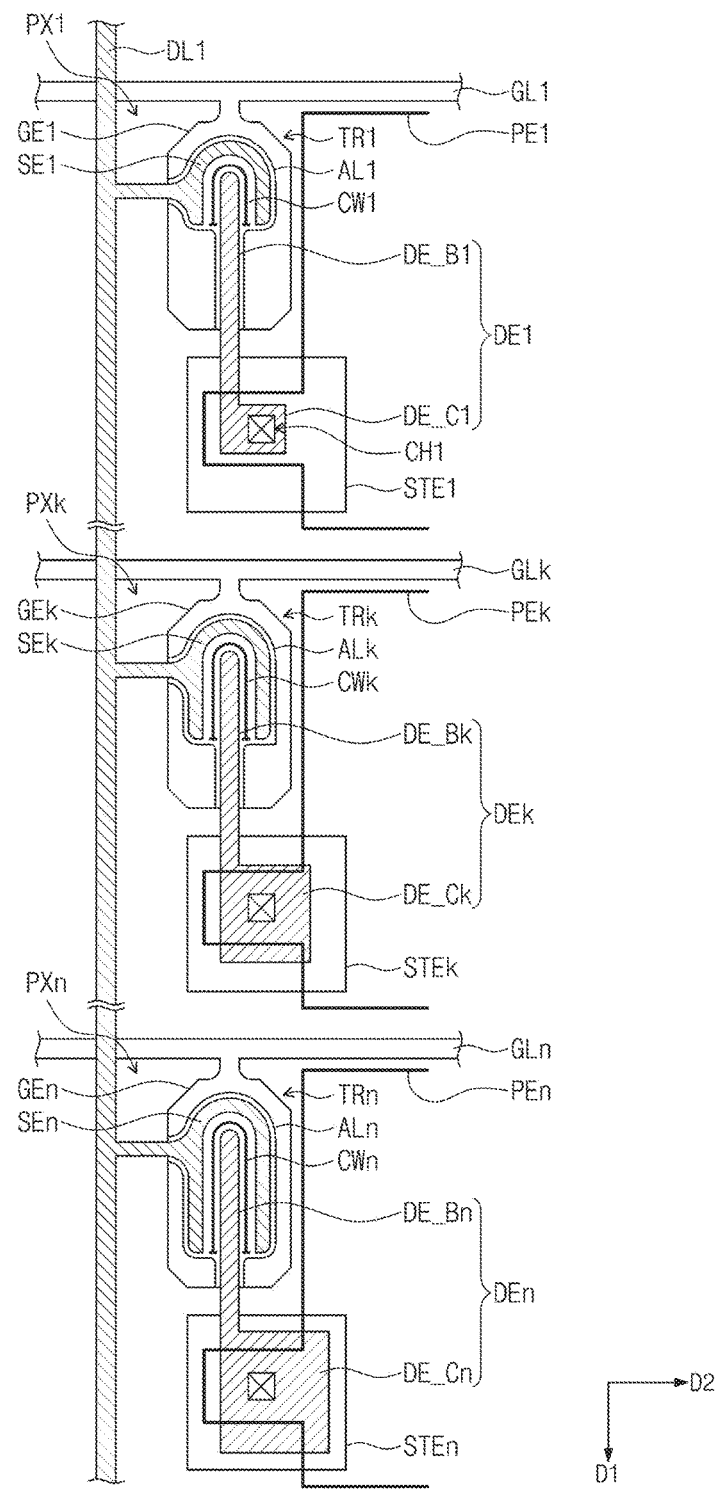
FIG. 5 is a plan view of a second embodiment of display device constructed according to the principles of the invention illustrating the size of the overlapping area between the drain electrode and storage capacitor of the pixels increasing along a data line.

FIG. 5 is a plan view of a second embodiment of display device constructed according to the principles of the invention illustrating the size of the overlapping area between the drain electrode and storage capacitor of the pixels increasing along a data line. In FIG. 5, the same reference numerals as those in FIG. 2 refer to the same components and their overlapping descriptions will be omitted to avoid redundancy.

Referring to FIG. 5, in order to compensate for the delay of the data signal, the channel width of each of the plurality of thin film transistors TR1 to TRn connected to the first data line DL1 increases as the distance between a corresponding thin film transistor and the data driving circuit 130 increases. This is identical to that of the embodiment of FIG. 2.

If the channel width of each of the plurality of thin film transistors TR1 to TRn varies according to the distance from the data driving circuit 130, a deviation of the kickback voltage Vkb results between the plurality of thin film transistors TR1 to TRn. Unlike the embodiment of FIG. 2, FIG. 5 discloses an embodiment for compensating for the deviation of the kickback voltage Vkb by adjusting the storage capacitance Cst of each pixel.

Each pixel includes a thin film transistor, a liquid crystal capacitance Clc, and a storage capacitance Cst. According to Equation 1 above, as the storage capacitance Cst increases, the kickback voltage Vkb decreases. Accordingly, by adjusting an increase rate of the storage capacitance Cst according to an increase rate of the channel width, the deviation of the pixel-specific kickback voltage Vkb may be adjusted.

As shown in FIG. 5, the kth thin film transistor TRk has a kth channel width CWk greater than a first channel width CW1 of the first thin film transistor TR1. The kth channel width CWk increases as the size of the kth source electrode SEk of the kth thin film transistor TRk increases greater than the size of the first source electrode SE1.

The first pixel PX1 includes the first thin film transistor TR1 and a first pixel electrode PE1 and the first thin film transistor TR1 includes the first gate electrode GE1, the first source electrode SE1, and the first drain electrode DE1. The first drain electrode DE1 is electrically connected to the first pixel electrode PE1 through a first contact hole CH1.

The first pixel PX1 further includes a first storage electrode STE1. The first storage electrode STE1 overlaps the first drain electrode DE1 to form a first storage capacitance Cst1.

The first drain electrode DE1 includes a first body part DE_B1 and a first contact part DE_C1. The first body part DE_B1 is a part for forming the first channel area where it faces the first source electrode SE1. The first contact part DE_C1 is a part overlapping the first storage electrode STE1, and contacting the first pixel electrode PE1. The size of the first storage capacitance Cst1 is determined based upon the size of the overlapping area of the first contact part DE_C1 and the first storage electrode STE1.

A kth pixel PXk includes the kth thin film transistor TRk, a kth pixel electrode PEk, and a kth storage electrode STEk. The kth storage electrode STEk forms a kth storage capacitance Cstk where it overlaps the kth drain electrode DEk of the kth thin film transistor TRk.

The kth drain electrode DEk includes a kth body part DE_Bk and a kth contact part DE_Ck. The size of the kth contact part DE_Ck is greater than the size of the first contact part DE_C1. Accordingly, the overlapping area of the kth contact part DE_Ck and the kth storage electrode STEk increases greater than the overlapping area of the first contact part DE_C1 and the first storage electrode STE1. Accordingly, the kth storage capacitance Cstk may have a greater value than the first storage capacitance Cst1.

Even if a difference of the first and kth parasite capacitances Cgs1 and Cgsk occurs between the first and kth thin film transistors TR1 and TRk, by varying the first and kth storage capacitances Cst1 and Cstk in such a manner, the deviation of the kickback voltage Vkb between the first and kth pixels PX1 and PXk may be reduced or removed.

Similarly, an nth pixel PXn includes the nth thin film transistor TRn, an nth pixel electrode PEn, and an nth storage electrode STEn. The nth storage electrode STEn forms an nth storage capacitance Cstn where it overlaps the nth drain electrode DEn of the nth thin film transistor TRn.

The nth drain electrode DEn includes an nth body part DE_Bn and an nth contact part DE_Cn. The size of the nth contact part DE_Cn is greater than the size of the kth contact part DE_Ck. Accordingly, the overlapping area of the nth contact part DE_Cn and the nth storage electrode STEn increases greater than an overlapping area of the kth contact part DE_Ck and the kth storage electrode STEk. Accordingly, the nth storage capacitance Cstn may have a greater value than the kth storage capacitance Cstk.

Even if a difference of the kth and nth parasite capacitances Cgsk and Cgsn occurs between the kth and nth thin film transistors TRk and TRn, by varying the kth and nth storage capacitances Cstk and Cstn in such a manner, the deviation of the kickback voltage Vkb between the kth and nth pixels PXk and PXn may be reduced or removed.

Figure 6:
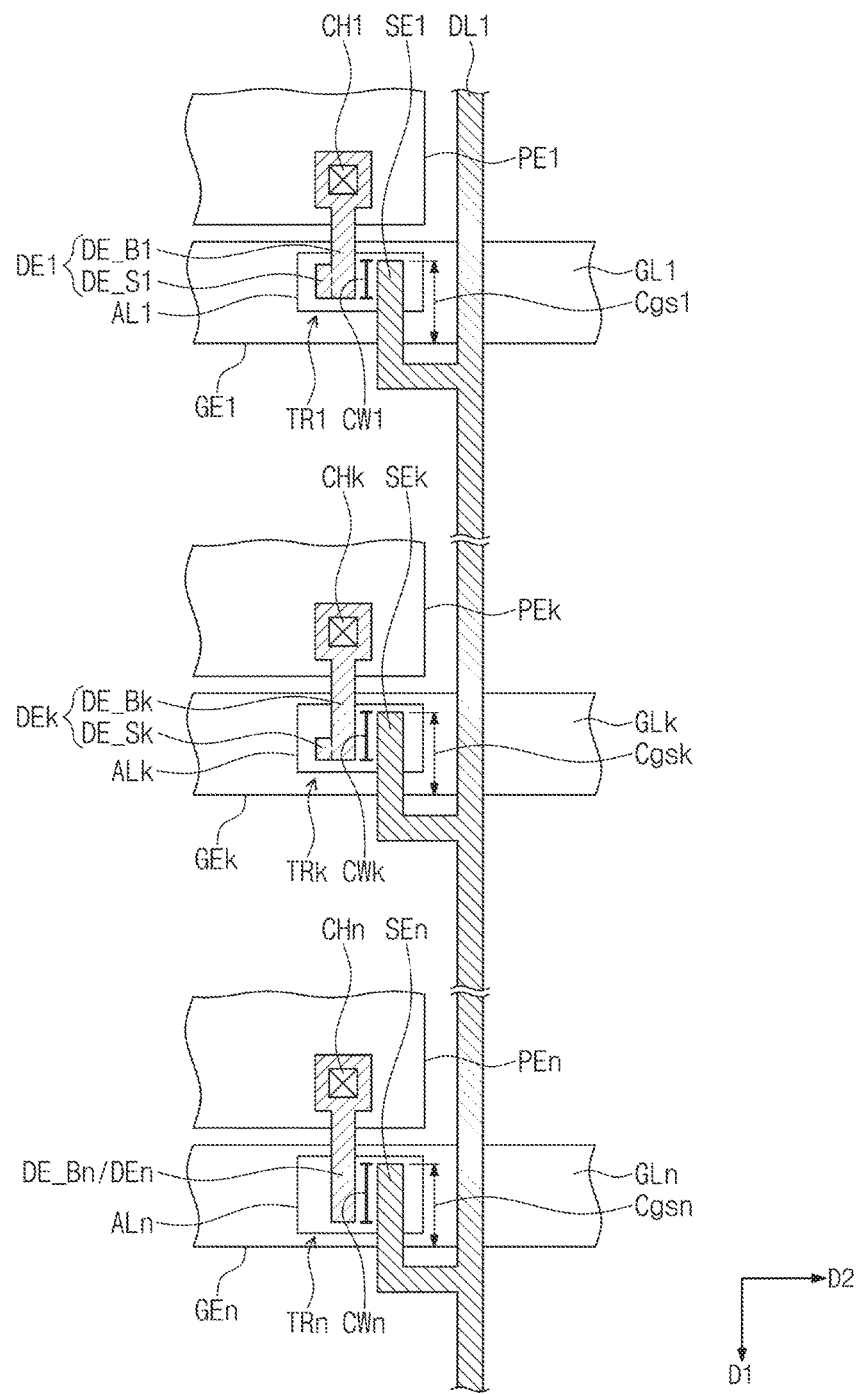
FIG. 6 is a plan view of a third embodiment of display device constructed according to the principles of the invention illustrating thin film transistors having I-shaped channels connected to a first data line.

FIG. 6 is a plan view of a third embodiment of display device constructed according to the principles of the invention illustrating thin film transistors having I-shaped channels connected to a first data line.

Referring to FIG. 6, the plurality of thin film transistors TR1 to TRn are connected to the first data line DL1 along the first direction D1 FIG. 6 illustrates that each of the plurality of thin film transistors TR1 to TRn has an I-shaped channel structure. Additionally, FIG. 6 illustrates only the first, kth, and nth thin film transistors TR1, TRk, and TRn of the plurality of thin film transistors TR1 to TRn, connected to a first gate line GL1, a kth gate line GLk, and an nth gate line GLn.

In order to compensate for the delay of the data signal, the channel width of each of the plurality of thin film transistors TR1 to TRn connected to the first data line DL1 increases as the distance between a corresponding thin film transistor and the data driving circuit 130 increases. Accordingly, as the more distant a pixel is away from the data driving circuit 130, charging rate deterioration may be reduced.

According to an embodiment of FIG. 6, the area overlapping the source electrode and the gate electrode of each thin film transistor does not increase but remains constant as the distance between the corresponding thin film transistor and the data driving circuit 130 increases. That is, the plurality of thin film transistors TR1 to TRn has the same size as the source electrode. Moreover, the channel width of each of the plurality of thin film transistors TR1 to TRn is adjusted by the drain electrode of a corresponding thin film transistor.

In more detail, the first, kth, and nth thin film transistors TR1, TRk, and TRn have first, kth, and nth channel widths CW1, CWk, and CWn, respectively. In the order of the first, kth, and nth thin film transistors TR1, TRk, and TRn, they are spaced further away from the data driving circuit 130. The kth channel width CWk is greater than the first channel width CW1 and the nth channel width CWn is greater than the kth channel width CWk. Therefore, the deterioration of a pixel charging rate due to a delay of a data signal applied to the first data line DL1 may be reduced or prevented.

Herein, a parasite capacitance Cgs1 is formed between the first source electrode SE1 and the first gate electrode GE1, a parasite capacitance Cgsk is formed between the kth source electrode SEk and the kth gate electrode GEk, and a parasite capacitance Cgsn is formed between the nth source electrode SEn and the nth gate electrode GEn. Since the sizes of the first, kth, and nth source electrodes are the same in this embodiment, the sizes of the parasite capacitances of Cgs1, Cgsk, and Cgsn are the same. In this embodiment, the first, kth, and nth channel widths CW1, CWk, and CWn are adjusted by the first, kth, and nth drain electrodes DE1, DEk, DEn of the respective first, kth, and nth thin film transistors TR1, TRk, and TRn.

The first drain electrode DE1 includes a first body part DE_B1 and a first auxiliary part DE_S1. The first body part DE_B1 defines a first channel area where it is spaced apart from the first source electrode SE1. The first channel area has the first channel width CW1. The first auxiliary part DE_S1 extends from the first body part DE_B1 in an area that does not affect the increase or decrease of the first channel width CW1.

When it is assumed that a parasite capacitance between the first body part DE_B1 and the first gate electrode GE1 is Cgd_B1 and a parasite capacitance between the first auxiliary part DE_S1 and the first gate electrode GE1 is Cgd_S1, a first parasite capacitance Cgd1 between the first drain electrode DE1 and the first gate electrode GE1 is defined as the sum of Cgd_B1 and Cgd_S1.

The kth drain electrode DEk includes a kth body part DE_Bk and a kth auxiliary part DE_Sk. The kth body part DE_Bk defines a kth channel area where it is spaced apart from the kth source electrode SEk. The kth body part DE_Bk is longer than the first body part DE_B1, so that the second channel area has a kth channel width CWk greater than the first channel width CW1. The kth auxiliary part DE_Sk extends from the kth body part DE_Bk in an area that does not affect the increase or decrease of the kth channel width CWk. Herein, the size of the kth auxiliary part DE_Sk is smaller than the size of the first auxiliary part DE_S1.

When it is assumed that a parasite capacitance between the kth body part DE_Bk and the kth gate electrode GEk is Cgd_Bk and a parasite capacitance between the kth auxiliary part DE_Sk and the kth gate electrode GEk is Cgd_Sk, a kth parasite capacitance Cgdk between the kth drain electrode DEk and the kth gate electrode GEk is defined as the sum of Cgd_Bk and Cgd_Sk.

As the size of the kth body part DE_Bk increases greater than the size of the first body part DE_B1, the parasite capacitance Cgd_Bk increases greater than the parasite capacitance Cgd_B1, but by forming the size of the kth auxiliary part DE_Sk to be smaller than the size of the first auxiliary part DE_S1, the parasite capacitance Cgd_Sk may be less than the parasite capacitance Cgd_S1. Accordingly, overall, no difference between the first parasite capacitance Cgd1 and the kth parasite capacitance Cgdk may occur.

In such a manner, the channel widths of the first thin film transistor TR1 and the kth thin film transistor TRk are different from each other, but the sizes of the first and kth parasite capacitances Cgd1 and Cgdk are the same. Therefore, a kickback voltage deviation is reduced or does not occur.

Moreover, the nth drain electrode DEn includes only an nth body part DE_Bn. According to this embodiment, the nth drain electrode DEn does not include an additional auxiliary part. The nth body part DE_Bn is longer than the kth body part DE_Bk, so that the nth channel area has an nth channel width CWn greater than the kth channel width CWk.

Herein, the size of the nth body part DE_Bn is identical to the sum of the sizes of the first body part DE_B1 and the first auxiliary part DE_S1 and may be identical to the sum of the sizes of the kth body part DE_Bk and the kth auxiliary part DE_Sk. Accordingly, when a parasite capacitance between the nth body part DE_Bn and the nth gate electrode GEn is Cgdn, the parasite capacitance Cgdn may have the same size as the kth parasite capacitance Cgdk and the first parasite capacitance Cgd1.

In such a manner, since the sizes of the first, kth, and nth parasite capacitances Cgd1, Cgdk, and Cgdn are the same, image quality deterioration due to the deviation of the kickback voltage Vkb for each pixel may be reduced or prevented.

Figure 7:
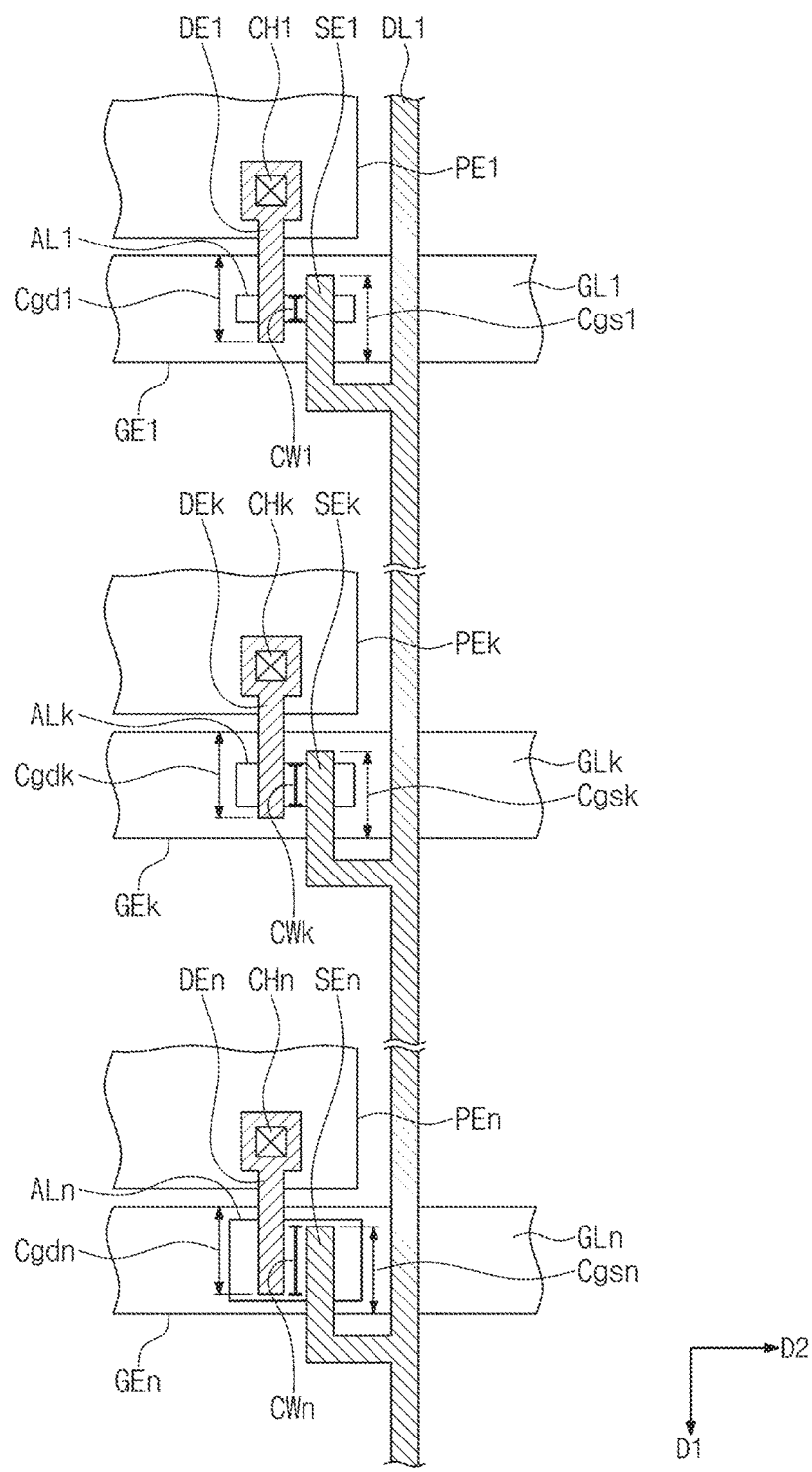
FIG. 7 is a plan view of a fourth embodiment of display device constructed according to the principles of the invention illustrating thin film transistors connected to a first data line having semiconductor layers that increase in size along the data line.

FIG. 7 is a plan view of a fourth embodiment of display device constructed according to the principles of the invention illustrating thin film transistors connected to a first data line having semiconductor layers that increase in size along the data line.

Referring to FIG. 7, the plurality of thin film transistors TR1 to TRn are connected to the first data line DL1 along the first direction D1 FIG. 7 illustrates that each of the plurality of thin film transistors TR1 to TRn has an I-shaped channel structure. In order to compensate for the delay of the data signal, the channel width of each of the plurality of thin film transistors TR1 to TRn connected to the first data line DL1 increases as the distance between a corresponding thin film transistor and the data driving circuit 130 increases.

According to an embodiment of FIG. 7, the overlapping area of the source electrode and the gate electrode does not increase but remains constant as the distance between a corresponding thin film transistor and the driving circuit 130 increases, and the overlapping area of the drain electrode and the gate electrode does not increase but remains constant as the distance between a corresponding thin film transistor and the driving circuit 130 increases. Moreover, the channel width of each of the plurality of thin film transistors TR1 to TRn is adjusted by the size of the semiconductor layer of a corresponding thin film transistor.

The first semiconductor layer AL1 of the first thin film transistor TR1 closest to the data driving circuit 130 has a first size and the kth semiconductor layer ALk of the kth thin film transistor TRk has a second size greater than the first size of the first semiconductor layer AL1. The nth semiconductor layer ALn of the nth thin film transistor TRn has a third size greater than the second size of the kth semiconductor layer ALk. The first, kth, and nth semiconductor layers AL1, ALk, and ALn have the same width in the second direction D2, and the width in the first direction D1 may increase in the order of the first, kth, and nth semiconductor layers AL1, ALk, and ALn.

Accordingly, the first channel area of the first thin film transistor TR1 has a first channel width CW1 determined by the first semiconductor layer AL1 and the kth channel area of the kth thin film transistor TRk has a kth channel width CWk determined by the kth semiconductor layer ALk. That is, the kth channel width CWk has a greater size than the first channel width CW1 by the width of the kth semiconductor layer ALk increased in the first direction D1.

Additionally, the nth channel area of the nth thin film transistor TRn has an nth channel width CWn determined by the nth semiconductor layer ALn. That is, the nth channel width CWn has a greater size than the first channel width CW1 by the width of the kth semiconductor layer ALk increased in the first direction D1.

Furthermore, a parasite capacitance Cgd1 is formed between the first drain electrode DE1 and the first gate electrode GE1, a parasite capacitance Cgdk is formed between the kth drain electrode DEk and the kth gate electrode GEk, and a parasite capacitance Cgdn is formed between the nth drain electrode DEn and the nth gate electrode GEn. The parasite capacitances Cgd1, Cgdk, and Cgdn may have the same predetermined value regardless of the first, kth, and nth channel widths CW1, CWk, and CWn.

Additionally, a parasite capacitance Cgs1 is formed between the first source electrode SE1 and the first gate electrode GE1, a parasite capacitance Cgsk is formed between the kth source electrode SEk and the kth gate electrode GEk, and a parasite capacitance Cgsn is formed between the nth source electrode SEn and the nth gate electrode GEn. The parasite capacitances Cgs1, Cgsk, and Cgsn may have the same predetermined value regardless of the first, kth, and nth channel widths CW1, CWk, and CWn.

In such a way, by adjusting the channel widths of the thin film transistors TR1 to TRn by adjusting the size of a semiconductor layer, deviations in kickback voltage Vkb for each pixel may be reduced or prevented.

Figure 8:
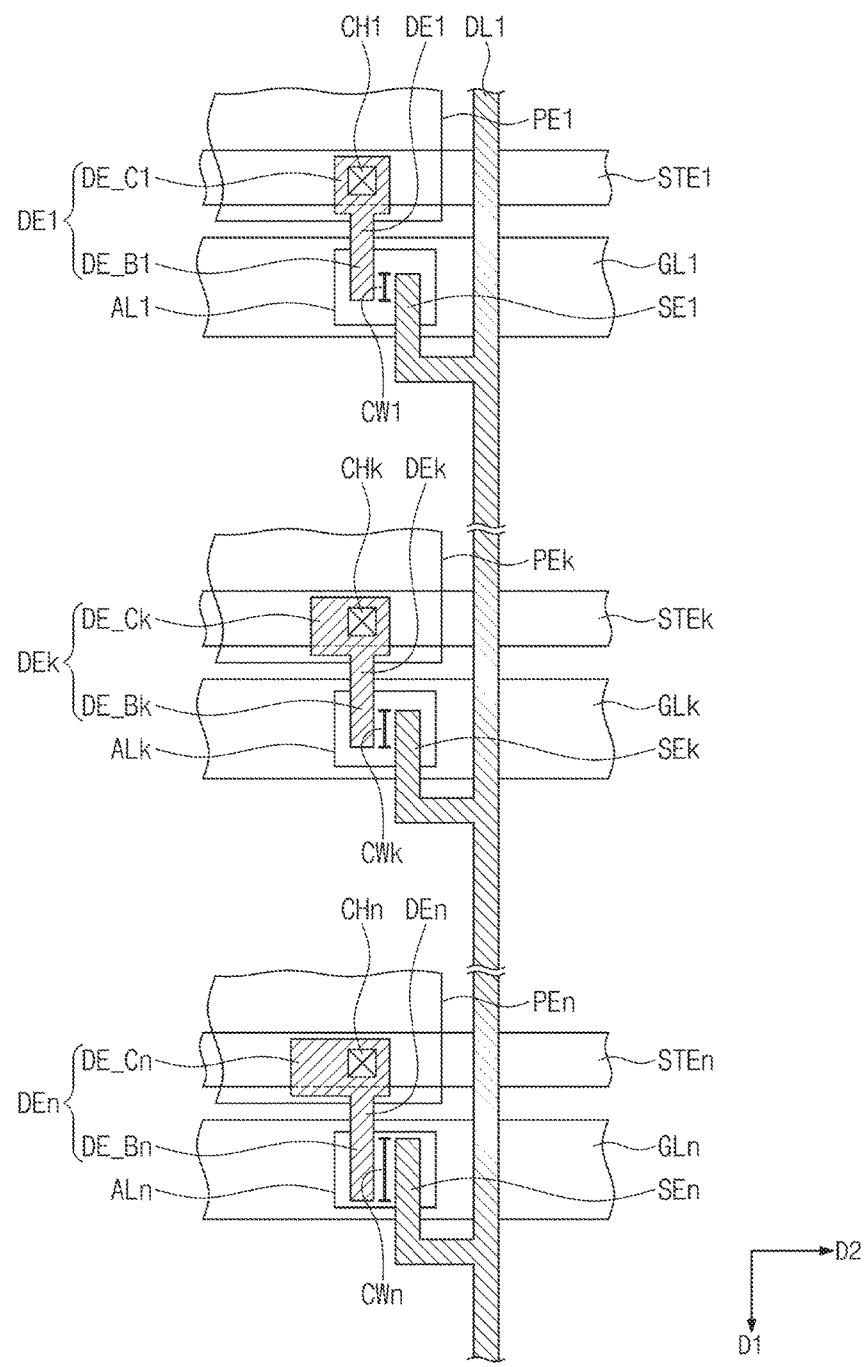
FIG. 8 is a plan view of a fifth embodiment of display device constructed according to the principles of the invention illustrating thin film transistors connected to a first data line having storage capacitances that increase along the date line.

FIG. 8 is a plan view of a fifth embodiment of display device constructed according to the principles of the invention illustrating thin film transistors connected to a first data line having storage capacitances that increase along the date line.

Referring to FIG. 8, in a pixel that employs a thin film transistor having an I-shaped channel structure, a storage capacitance Cst may be used in order to reduce a deviation of a kickback voltage Vkb for each pixel based upon the difference in channel widths. That is, by adjusting the increase of the storage capacitance Cst based upon the increase of the channel width, the deviation of the kickback voltage Vkb may be adjusted.

As shown in FIG. 8, the kth thin film transistor TRk has a kth channel width CWk greater than a first channel width CW1 of the first thin film transistor TR1. The kth channel width CWk increases as the sizes of the kth drain electrode DEk and the kth source electrode SEk of the kth thin film transistor TRk increase greater than the sizes of the first drain electrode DE1 and the first source electrode SE1. Accordingly, a difference in the amount of parasite capacitances occurs between the first thin film transistor TR1 and the kth thin film transistor TRk.

According to the embodiment of FIG. 8, the first drain electrode DE1 of the first thin film transistor TR1 includes a first body part DE_B1 and a first contact part DE_C1. The first body part DE_B1 is a part for forming the first channel area where it is spaced from the first source electrode SE1. The first contact part DE_C1 is a part overlapping the first storage electrode STE1 and contacting the first pixel electrode PE1. The size of the first storage capacitance Cst1 is determined based upon the size of the overlapping area of the first contact part DE_C1 and the first storage electrode STE1.

The kth drain electrode DEk of the kth thin film transistor TRk includes a kth body part DE_Bk and a kth contact part DE_Ck. The size of the kth contact part DE_Ck is greater than the first contact part DE_C1. Accordingly, an overlapping area of the kth contact part DE_Ck and the kth storage electrode STEk increases greater than an overlapping area of the first contact part DE_B1 and the first storage electrode STE1. Accordingly, the kth storage capacitance Cstk may have a greater value than the first storage capacitance Cst1.

Even if a difference of the first and kth parasite capacitances Cgs1 and Cgsk occurs between the first and kth thin film transistors TR1 and TRk, by providing a difference to the first and kth storage capacitances Cst1 and Cstk in such a manner, the deviation of the kickback voltage Vkb between the first and kth pixels PX1 and PXk may be removed.

The nth drain electrode DEn of the nth thin film transistor TRn includes an nth body part DE_Bn and an nth contact part DE_Cn. The size of the nth contact part DE_Cn is greater than the kth contact part DE_Ck. Accordingly, the overlapping area between the nth contact part DE_Cn and the nth storage electrode STEn increases greater than the overlapping area between the kth contact part DE_Ck and the kth storage electrode STEk. Accordingly, the nth storage capacitance Cstn may have a greater value than the kth storage capacitance Cstk.

In such a manner, deviation of the kickback voltage Vkb between the kth and nth pixels PXk and PXn may be reduced or removed even if a difference of the kth and nth parasite capacitances Cgsk and Cgsn occurs between the kth and nth thin film transistors TRk and TRn, due to the difference to the kth and nth storage capacitances Cstk and Cstn. As a result, by removing the deviation of the kickback voltage Vkb between the first, kth, and nth thin film transistors TR1, TRk, and TRn, image quality deterioration due to the deviation of the kickback voltage Vkb for each pixel may be reduced or prevented.

Figure 9:
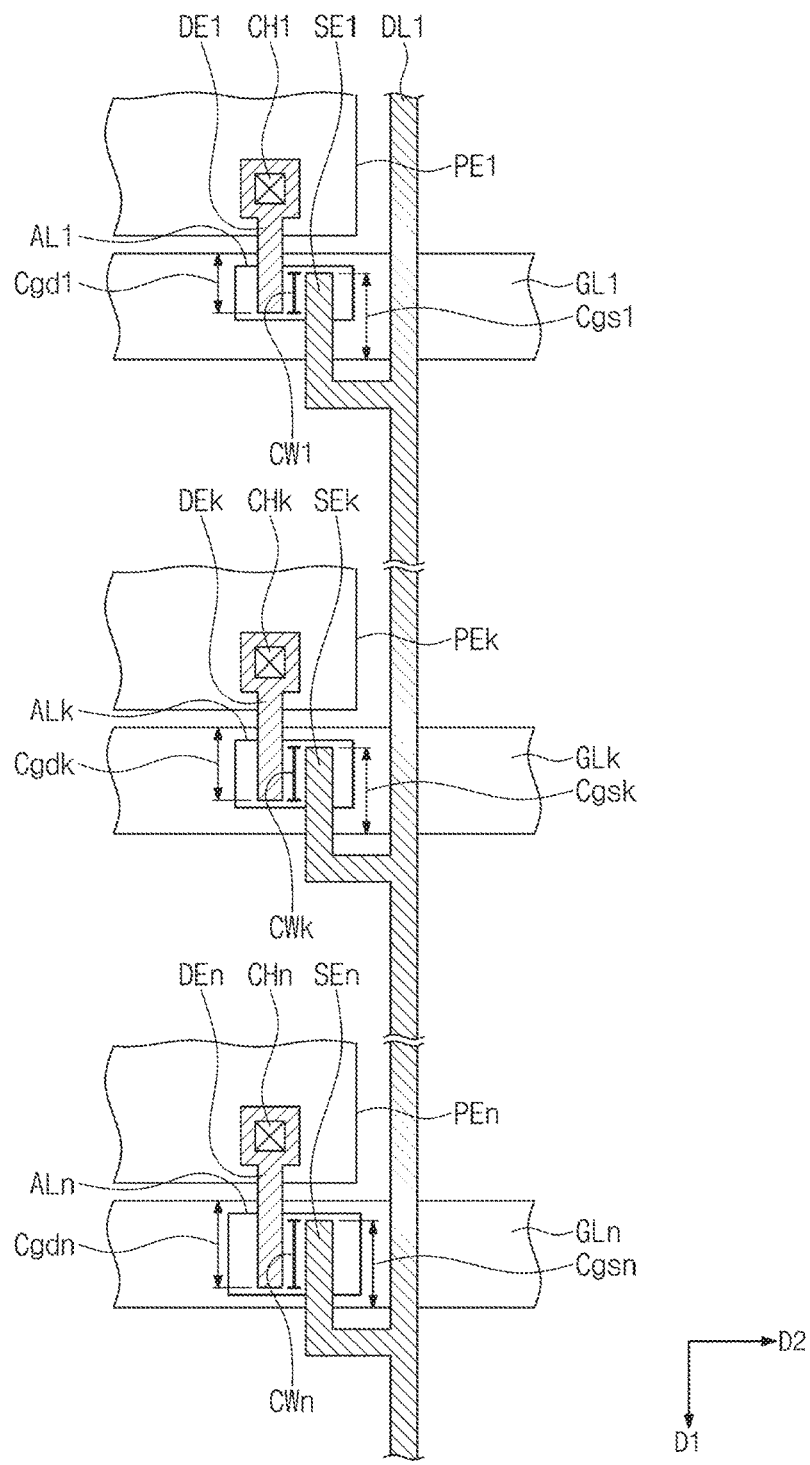
FIG. 9 is a plan view of a sixth embodiment of display device constructed according to the principles of the invention in which a charge sharing method may be used to reduce differences in kickback voltages between thin film transistors connected along a first data line.
Figure 10:
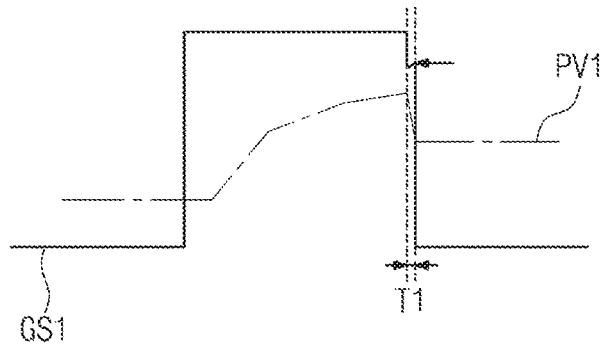
FIG. 10 is a waveform diagram illustrating first, kth, and nth gate signals applied to first, kth, and nth gate lines shown in FIG. 9.
Figure 10:
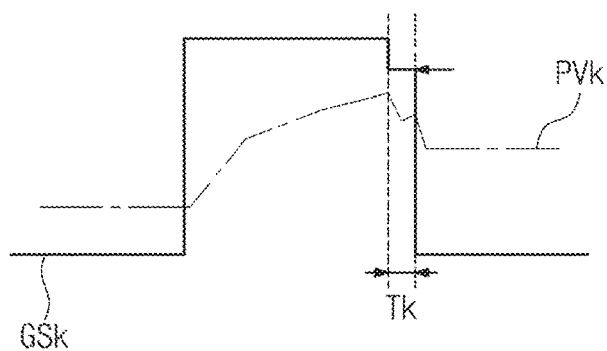
Figure 10:
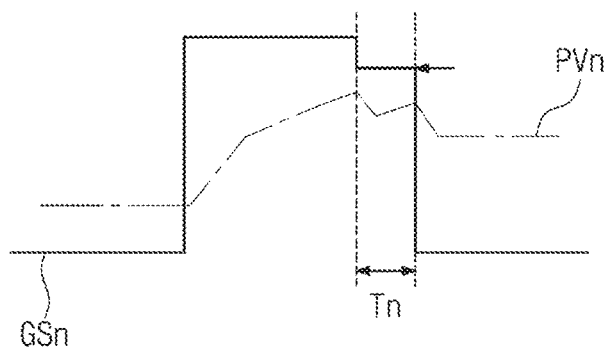

FIG. 9 is a plan view of a sixth embodiments of display device constructed according to the principles of the invention in which a charge sharing method may be used to reduce differences in kickback voltages between thin film transistors connected along a first data line. FIG. 10 is a waveform diagram illustrating first, kth, and nth gate signals applied to first, kth, and nth gate lines shown in FIG. 9.

Referring to FIGS. 9 and 10, in a pixel that employs a thin film transistor having an I-shaped channel structure, a method for adjusting the charge sharing time of a gate signal may be used in order to reduce the deviation of a kickback voltage caused by a difference between channel widths. That is, by increasing the charge sharing time of the gate signal based upon the increase of the channel width, the deviation of the kickback voltage Vkb for each pixel may be adjusted.

As shown in FIG. 9, the kth thin film transistor TRk has a kth channel width CWk greater than a first channel width CW1 of the first thin film transistor TR1. The kth channel width CWk increases as the sizes of the kth drain electrode DEk and the kth source electrode SEk of the kth thin film transistor TRk increase greater than the sizes of the first drain electrode DE1 and the first source electrode SE1. Accordingly, the amount of parasite capacitances between the first thin film transistor TR1 and the kth thin film transistor TRk is different.

The nth thin film transistor TRn has an nth channel width CWn greater than a kth channel width CWk of the kth thin film transistor TRk. The nth channel width CWn increases as the sizes of the nth drain electrode DEn and the nth source electrode SEn of the nth thin film transistor TRn increase greater than the sizes of the kth drain electrode DEk and the kth source electrode SEk. Accordingly, the amount of parasite capacitances between the kth thin film transistor TRk and the nth thin film transistor TRn is different.

Referring to FIG. 10, the first, kth, and nth gate signals GS1, GSk, and GSn are applied to first, kth, and nth gate lines GL1, GLk, and GLn, respectively.

The first, kth, and nth gate signals GS1, GSk, and GSn have charge sharing sections of different lengths in order to compensate for the deviation of the parasite capacitance between the first, kth, and nth thin film transistors TR1, TRk, and TRn.

In more detail, the first gate signal GS1 has the shortest first sharing section T1 and the kth gate signal GSk has a kth sharing section Tk longer than the first sharing section T1. The nth gate signal GSn has an nth sharing section Tn longer than the kth sharing section Tk.

Additionally, FIG. 10 illustrates first, kth, and nth pixel voltages PV1, PVk, and PVn, which are charged at the first, kth, and nth pixels PX1, PXk, and PXn, respectively, according to the voltage of the data signal supplied through the first data line DL1. The first, kth, and nth pixel voltages PV1, PVk, and PVn have different waveforms according to the lengths of the first, kth, and nth sharing sections T1, Tk, and Tn.

Figure 11:
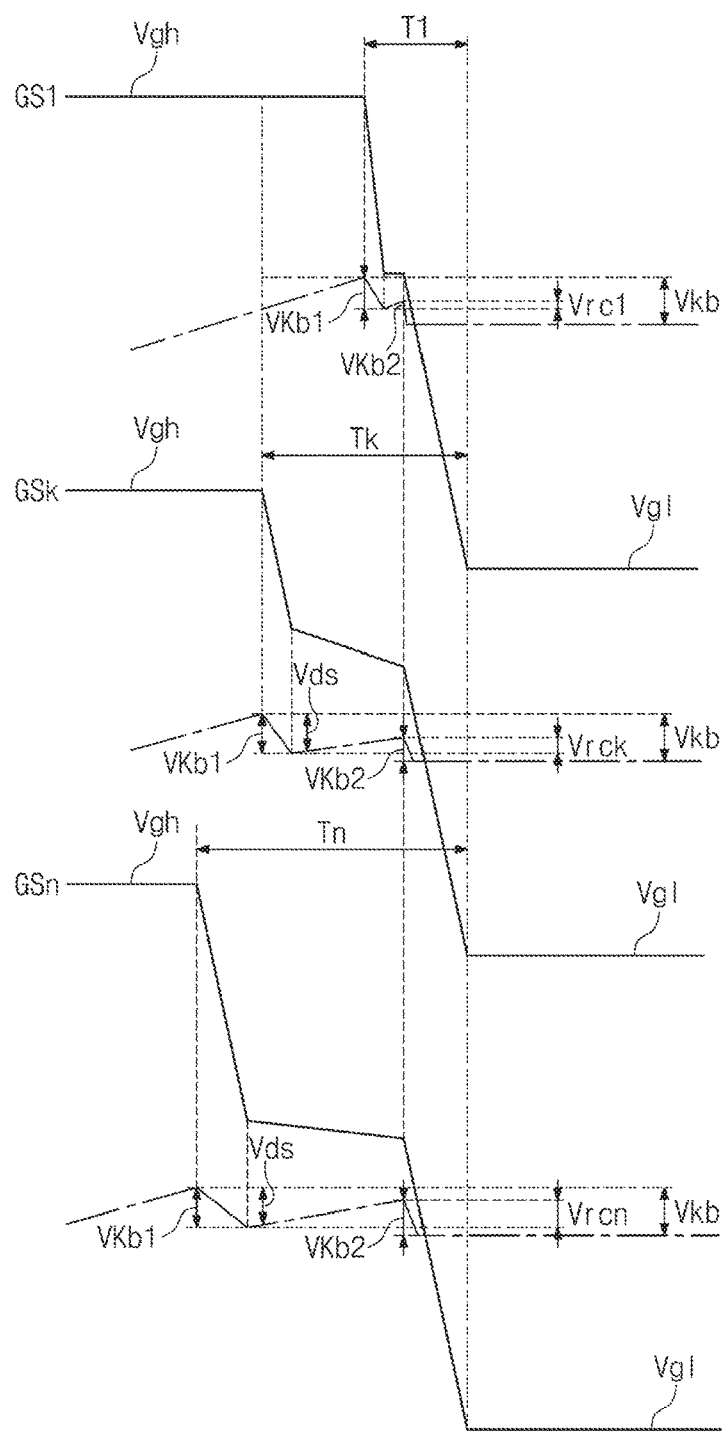
FIG. 11 is a view illustrating a detailed waveform structure in first, kth, and nth sharing sections of FIG. 10.

FIG. 11 is a view illustrating a detailed waveform structure in first, kth, and nth sharing sections of FIG. 10.

Referring to FIG. 11, when the first gate signal GS1 has a high voltage Vgh, the first thin film transistor TR1 is turned on so that the first pixel voltage PV1 is charged to the first pixel PX1. The first pixel voltage PV1 rises from a rising time point of the first gate signal GS1 to a start time point of the first sharing section T1. When the first sharing section T1 starts, the charged first pixel voltage PV1 is reduced by a first kickback voltage Vkb1 in response to the decrease of the voltage of the first gate signal GS1. During the first sharing section T1, the first gate signal GS1 is maintained as an intermediate voltage. During the first sharing section T1, the first pixel voltage PV1 is recharged by a first voltage Vrc1 due to the occurrence of a voltage between the source and the drain of the first thin film transistor TR1. When the first sharing section T1 ends and switches to a low section where the first gate signal GS1 has a low voltage Vgl, the first pixel voltage PV1 is reduced again by a second kickback voltage Vkb2 in response to the decrease of the voltage of the first gate signal GS1.

Due to a recharging phenomenon of the first pixel voltage PV1, the entire kickback voltage Vkb of the first pixel PX1 is reduced less than the sum of the first and second kickback voltages Vkb1 and Vkb2. The entire kickback voltage Vkb is reduced by a first voltage Vrc1 by which the first pixel voltage PV1 is recharged. Herein, the first voltage Vrc1 by which the first pixel voltage PV1 is recharged varies based upon the length of the first sharing section T1.

Similarly, in relation to the kth pixel PXk, during the kth sharing section Tk, the kth pixel voltage PVk is recharged by the kth voltage Vrck due to the occurrence of a voltage Vds between the source and the drain of the kth thin film transistor TRk. Since the kth sharing section Tk is longer than the first sharing section T1, the kth voltage Vrck of the kth pixel voltage PVk is greater than the first voltage Vrc1 of the first pixel voltage PV1.

Accordingly, by a recharging phenomenon of the kth pixel voltage PVk, the voltage level that the entire kickback voltage Vkb of the kth pixel PXk is reduced less than the sum of the first and second kickback voltages Vkb1 and Vkb2 increases more than the first pixel PX1. In such a way, deviation of a kickback voltage between the first pixel PX1 and the kth pixel PXk due to a difference in parasite capacitances may be compensated for by allowing the length of the kth sharing section Tk to be longer than the first sharing section T1.

Also, in relation to the nth pixel PXn, during the nth sharing section Tn, the nth pixel voltage PVn is recharged by the nth voltage Vrcn due to the occurrence of a voltage Vds between the source and the drain of the nth thin film transistor TRn. Since the nth sharing section Tn is longer than the kth sharing section Tk, the nth voltage Vrcn of the nth pixel voltage PVn is greater than the kth voltage Vrck of the kth pixel voltage PVk.

By the recharging phenomenon of the nth pixel voltage PVn, the voltage level by which the entire kickback voltage Vkb of the nth pixel PXn is reduced less than the sum of the first and second kickback voltages Vkb1 and Vkb2 increases more than the kth pixel PXk. Accordingly, deviation of a kickback voltage between the kth pixel PXk and the nth pixel PXn due to a difference in parasite capacitances may be compensated for by allowing the length of the nth sharing section Tn to be longer than the kth sharing section Tk.

Figure 12:
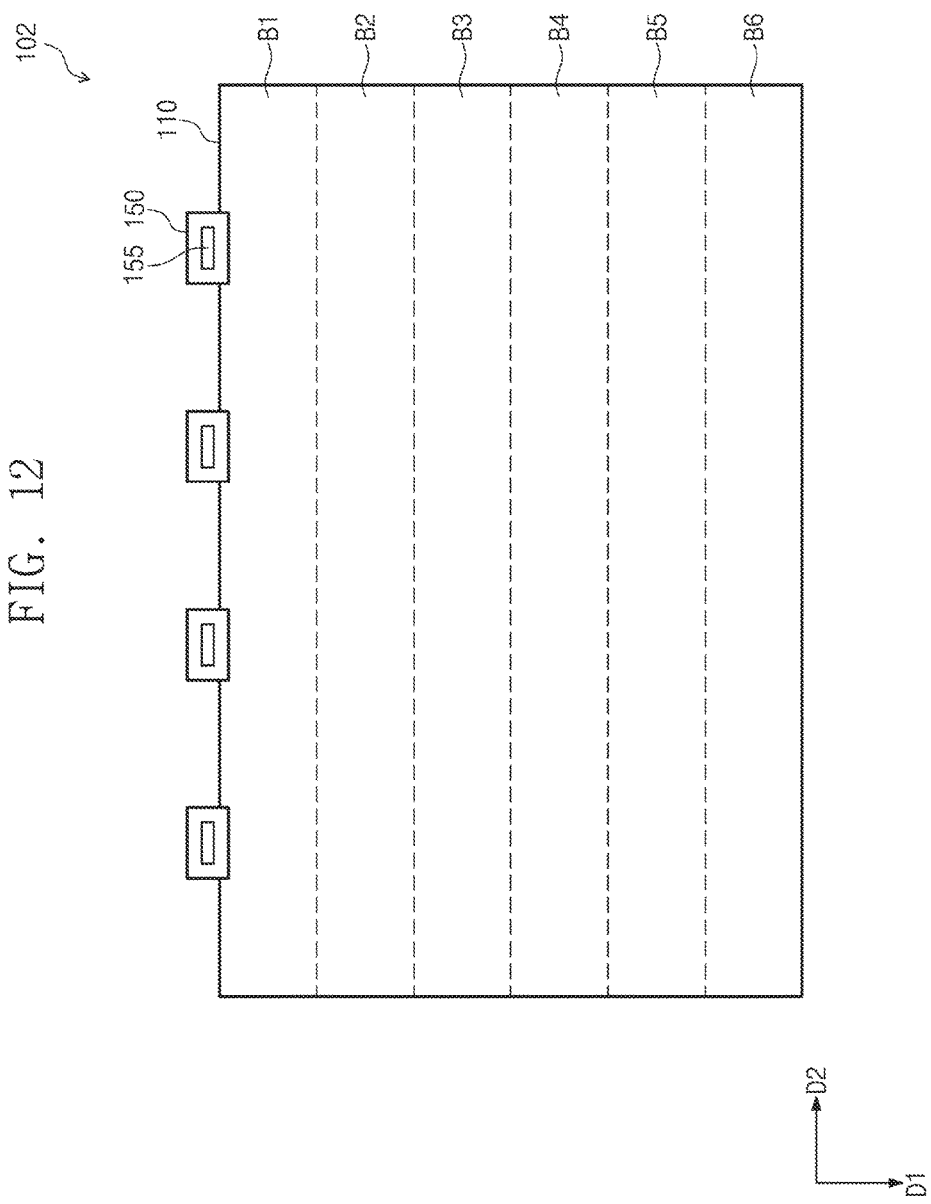
FIG. 12 is a plan view of another embodiment of a display device constructed according to the principles of the invention illustrating the display panel being divided into blocks.

FIG. 12 is a plan view of another embodiment of a display device constructed according to the principles of the invention illustrating the display panel being divided into blocks.

Referring to FIG. 12, a display device 102 includes a plurality of flexible circuit films 150 attached to one side of the display panel 110. A driving chip 155 is mounted on the upper surface of each of the plurality of flexible circuit films 150. The data driving circuit 130 shown in FIG. 1 may be built in the driving chip 155.

The display panel 110 includes first to sixth block areas B1 to B6 arranged along the first direction D1. Although it is shown according to the embodiment of FIG. 12 that each of the first to sixth block areas B1 to B6 has the same width in the first direction D1, the exemplary embodiments are not limited thereto.

Additionally, although FIG. 12 illustrates that the number of block areas provided in the display panel 110 is six, the exemplary embodiments are not limited thereto and the number of block areas provided to the display panel 110 may vary according to the resolution and size of the display panel 110.

As shown in FIG. 12, the driving chip 155 is closest to the first block area B1 and furthest away from the sixth block area B6. In this case, the channel widths of the plurality of thin film transistors TR1 to TRnm (see FIG. 1) in the display panel 110 may increase gradually as the distance between a corresponding block area and the driving chip 155 increases.

In one or more exemplary embodiments, the channel widths of the thin film transistors TR1 to TRnm may vary in each of the block areas B1 to B6. As the distance from the driving chip 155 increases in each of the block areas B1 to B6, by increasing the channel widths of the thin film transistors TR1 to TRnm, the charging rate difference between pixels, which occurs as the data signal from the data driving circuit 130 is delayed, may be compensated for. One or more of the various compensation means (see, e.g., the embodiments of FIGS. 2 to 11) for compensating for a deviation of a kickback voltage, which occurs as the channel widths of the thin film transistors TR1 to TRnm vary, may change the compensation rate in each of the block areas B1 to B6.

The channel widths of the thin film transistors TR1 to TRnm may be changed based on a delay function of the data signal on the display panel 110 and as another example, may be changed in a form of a linear function or an exponential function.

In one or more exemplary embodiments, the channel widths of the thin film transistors TR1 to TRnm may vary by a unit of each of the block areas B1 to B6. That is, the thin film transistors TR1 to TRnm belonging to the same block area may have the same channel width and a channel width set in each of the block areas B1 to B6 may increase as a distance between a corresponding black area and the data driving circuit 130 increases.

The difference in channel widths between thin film transistors and the difference in channel widths between block areas may be determined by the total number of block areas, a resolution, and the minimum size of an E-beam grid used for forming channel widths.

Additionally, one of more of the various compensation means (see, e.g., the embodiments of FIGS. 2 to 11) for compensating for a deviation of a kickback voltage, which occurs as the channel widths of the thin film transistors TR1 to TRnm vary, may also be set to increase the compensation rate according to a unit of each of the block areas B1 to B6.

Figure 13A:
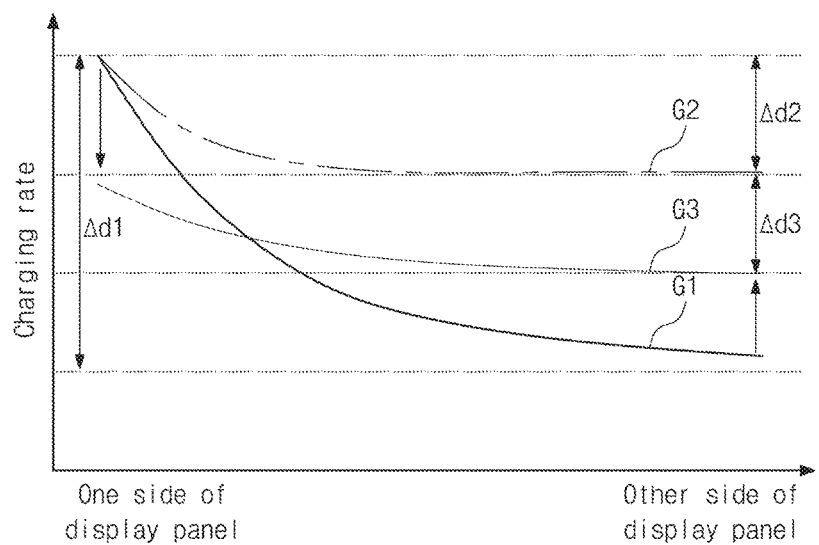
FIG. 13A is a graph illustrating the effect of improving the charging rate of a display panel in accordance with channel width change.

FIG. 13A is a graph illustrating the effect of improving the charging rate of a display panel in accordance with channel width change. In FIG. 13A, an x-axis represents a position on the display panel and a y-axis represents a charging rate.

Referring to FIG. 13A, a first graph G1 represents a charging rate in a comparison panel structure where a channel width does not vary and second and third graphs G2 and G3 represent that a charging rate deviation of the display panel is reduced by varying channel width.

According to the first graph G1, in the comparison panel structure, a difference Δd1 in charging rates occurs between one side of the display panel 110 adjacent to the data driving circuit 130 and the other side of the display panel 110 opposite to the one side.

Moreover, according to an embodiment apparent from the second graph G2, the channel width at one side of the display panel 110 is identical to the channel width at the one side of the comparison panel structure but increases gradually as the distance between a corresponding pixel and the data driving circuit 130 increases. In this case, the charging rate at one side of the display panel 110 is similar to that of the comparison panel structure but a difference Δd2 in charging rates between the one side and the other side of the display panel 110 is reduced further compared to the comparison panel structure.

According to an embodiment apparent from the third graph G3, the channel width at one side of the display panel 110 is less than a channel width at the one side of the comparison panel structure and increases gradually as the distance between a corresponding pixel and the data driving circuit 130 increases. In this case, the charging rate at one side of the display panel 110 is further reduced less than that of the comparison panel structure but a difference Δd3 in charging rates between the one side and the other side of the display panel 110 is reduced further compared to the comparison panel structure.

If the charging rate of the comparison panel structure is reduced with a first reduction rate from one side of the display panel 110 to the other side, the embodiments according to the second and third graphs G2 and G3 have a second reduction rate smaller than the first reduction rate. However, although the embodiment according to the second graph G2 has a higher overall charging rate than the embodiment according to the third graph G3, the size of a thin film transistor at the other side of the display panel 110 may be greater than that of the embodiment according to the third graph G3.

Figure 13B:
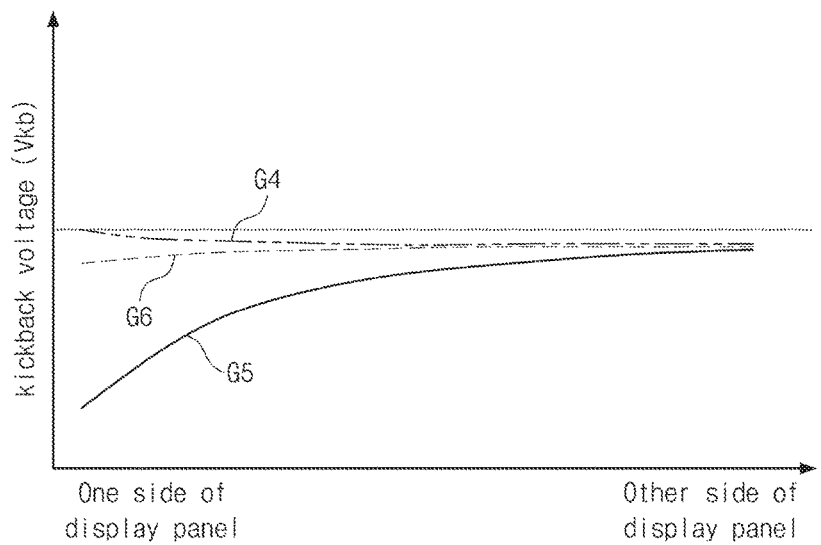
FIG. 13B is a graph illustrating the kickback voltage compensation effect of a display panel implementing the compensation means shown in FIGS. 2 to 11.

FIG. 13B is a graph illustrating the kickback voltage compensation effect of a display panel implementing the compensation means shown in FIGS. 2 to 11. In FIG. 13B, an x-axis represents a position on the display panel and a y-axis represents a kickback voltage.

Referring to FIG. 13B, a fourth graph G4 represents a kickback voltage change of a first comparison panel structure having no change in channel widths, a fifth graph G5 represents a kickback voltage change of a second comparison panel structure having a change in channel widths, and a sixth graph G6 represents a kickback voltage change of the display panel 110 that employs the kickback voltage compensation means shown in FIGS. 2 to 11.

According to the fourth graph G4, since the first comparison panel structure has no change in channel widths of thin film transistors, the kickback voltage from one side of the display panel 110 to the other side is maintained almost constant.

Moreover, as shown in the fifth graph G5, if the channel width of each thin film transistor increases from one side of the display panel 110 to the other side, the kickback voltage Vkb increases as the distance from the data driving circuit 130 increases. However, as shown in the sixth graph G6, when the kickback voltage compensation means shown in FIGS. 2 to 11 are employed, a kickback voltage deviation between the one side and the other side of the display panel 110 is reduced.

Therefore, according to the principles of the invention, the charging rate deviation and the kickback voltage deviation between the one side and the other side of the display panel 110 may be reduced simultaneously and as a result, image quality deterioration due to the charging rate deviation and the kickback voltage deviation may be reduced or prevented.

FIG. 14 is a plan view of yet another embodiment of a display device constructed according to the principles of the invention illustrating the display panel being divided into blocks disposed about a common line.

Referring to FIG. 14, a display device 103 includes a plurality of first flexible circuit films 150 attached to one side of the display panel 110 and a plurality of second flexible circuit films 160 attached to the other side of the display panel 110. A first driving chip 155 is mounted on the upper surface of each of the plurality of first flexible circuit films 150 and a second driving chip 165 is mounted on the upper surface of each of the plurality of second flexible circuit films 160. The data driving circuit 130 shown in FIG. 1 may be built in the first and second driving chips 155 and 165.

According to an embodiment shown in FIG. 14, the display panel 110 may be bisected based on a virtual line CL corresponding to the center of the one side and the other side. In the display panel 110, first to fourth block areas B1 to B4 are provided along the first direction D1 from the one side to the virtual line CL, and fifth to eighth block areas B5 to B8 are provided along a third direction opposite to the first direction D1 from the other side to the virtual line CL. FIG. 14 shows a structure in which the width in the first direction D1 of each of the first to eighth block areas B1 to B8 is the same. However, the width of each of the first to eighth block areas B1 to B8 may increase progressively as the distance from the virtual line CL decreases, so that the number of pixels included in each of the first to eighth block areas B1 to B8 may increase as the distance from the center decreases.

Additionally, although FIG. 14 illustrates that the number of block areas provided in the display panel 110 is eight, the exemplary embodiments are not limited thereto and the number of block areas provided to the display panel 110 may vary according to the resolution and size of the display panel 110.

As shown in FIG. 14, the first driving chip 155 is closest to the first block area B1 and farthest away from the fourth block area B4. In this case, the channel widths of the plurality of thin film transistors TR1 to TRnm (see FIG. 1) in the display panel 110 may increase gradually as the distance between a corresponding black area and the first driving chip 155 increases. Additionally, second driving chip 165 is closest to the fifth block area B5 and farthest away from the eighth block area B8. In this case, the channel widths of the plurality of thin film transistors TR1 to TRnm in the display panel 110 may increase gradually as the distance between a corresponding black area and the second driving chip 165 increases.

One or more of the various compensation means (see, e.g., the embodiments of FIGS. 2 to 11) for compensating for a deviation of a kickback voltage, which occurs as the channel widths of the thin film transistors TR1 to TRnm vary, may be used to change the compensation rate in each of the block areas B1 to B8.

In one or more exemplary embodiments, the channel widths of the thin film transistors TR1 to TRnm may vary by a unit of each of the block areas B1 to B8. That is, the thin film transistors TR1 to TRnm in the same block area may have the same channel width. Additionally, each of various compensation means (see, e.g., the embodiments of FIGS. 2 to 11) for compensating for the deviation of the kickback voltage, which occurs as the channel widths of the thin film transistors TR1 to TRnm vary, may also be set to increase the compensation rate according to a unit of each of the block areas B1 to B8.

According to the principles of the invention, in order to prevent pixels from having a kickback voltage deviation, e.g., due to changes in channel widths, a parasitic capacitance, the size of a semiconductor layer, or a storage capacitance for each of the plurality of thin film transistors in each pixel may be varied. Thereby, deterioration in image quality due to kickback voltage may be reduced or prevented.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device comprising:
    a display panel comprising a plurality of data lines extending in a first direction, a plurality of gate lines extending in a second direction intersecting the first direction, and a plurality of thin film transistors connected to the plurality of data lines and the plurality of gate lines, each of the thin film transistors having a channel width;
    a data driving circuit configured to supply a data signal to the plurality of data lines; and
    a gate driving circuit configured to supply a gate signal to the plurality of gate lines,
    wherein the channel width of each of the thin film transistors connected to the same data line increases as the distance between a corresponding thin film transistor and the data driving circuit increases;
    each of the plurality of thin film transistors has a gate electrode, a source electrode, a drain electrode and a parasite capacitance generated between the gate electrode and the drain electrode; and
    wherein the parasite capacitance between the gate electrode and the drain electrode of each of the thin film transistors connected to the same data line decreases as the distance between a corresponding thin film transistor and the data driving circuit increases.

2. The display device of claim 1, wherein the channel width of each of the thin film transistors connected to the same data line increases as an overlapping area of the source electrode and the gate electrode increases.

3. The display device of claim 2, wherein the parasite capacitance between the gate electrode and the drain electrode of each of the thin film transistors connected to the same data line decreases as an overlapping area of the gate electrode and the drain electrode decreases.

4. The display device of claim 3, wherein the drain electrode comprises:
    a main body part spaced from the source electrode to define a channel area; and
    an auxiliary part extending from the main body part and located outside the channel area to vary the parasite capacitance.

5. The display device of claim 4, wherein the channel area has a U-shape.

6. The display device of claim 1, wherein a channel area defined where the source electrode and the drain electrode spaced are from each other has an I-shape.

7. The display device of claim 6, wherein the drain electrode comprises:
    a main body part spaced from the source electrode to define the channel area; and
    an auxiliary part extending from the main body part and located outside the channel area to vary the parasite capacitance.

8. The display device of claim 7, wherein the channel width increases as an overlapping area of the main body part of the drain electrode and the gate electrode increases, and the parasite capacitance between the gate electrode and the drain electrode decreases as an overlapping area of the gate electrode and the auxiliary part decreases.

9. The display device of claim 1, wherein the display panel is divided into a plurality of blocks in the first direction;
    the channel width increases by a unit of the blocks; and
    the channel width is constant in the same block.

10. The display device of claim 9, wherein the difference in channel widths between the blocks is determined by the number of the blocks.

11. A display device comprising:
    a display panel comprising a plurality of data lines extending in a first direction, a plurality of gate lines extending in a second direction intersecting the first direction, a plurality of thin film transistors connected to the plurality of data lines and the plurality of gate lines, each of the thin film transistors having a channel width, and a plurality of pixel electrodes respectively connected to the plurality of thin film transistors;
    a data driving circuit configured to supply a data signal to the plurality of data lines; and
    a gate driving circuit configured to supply a gate signal to the plurality of gate lines, wherein the channel width of each of the thin film transistors increases as a distance between the corresponding thin film transistor and the data driving circuit increases;

each of the plurality of thin film transistors has a gate electrode, a source electrode, and a drain electrode;

the display panel further comprises a storage electrode configured to form a storage capacitance where it overlaps the drain electrode; and wherein the storage capacitance of each storage electrode increases as the distance between a corresponding thin film transistor and the data driving circuit increases.

12. The display device of claim 11, wherein the drain electrode comprises:

a main body part spaced from the source electrode to define a channel area; and a contact part electrically contacting the pixel electrode and overlapping the storage electrode, wherein the storage capacitance is determined by the amount of area overlapping the contact part and the storage electrode.

13. The display device of claim 12, wherein the channel area has a U-shape; and the channel width increases as the amount of area overlapping the source electrode and the gate electrode increases.

14. The display device of claim 12, wherein the channel area has an I-shape.

15. The display device of claim 14, wherein the channel width increases as the amount of area overlapping the source electrode and the gate electrode increases.

16. The display device of claim 14, wherein the channel width increases as the amount of area overlapping the drain electrode and the gate electrode increases.

17. A display device comprising:

a display panel comprising a plurality of data lines extending in a first direction, a plurality of gate lines extending in a second direction intersecting the first direction, a plurality of thin film transistors connected to the plurality of data lines and the plurality of gate lines, each of the thin film transistors having a channel width, and a plurality of pixel electrodes respectively connected to the plurality of thin film transistors;

a data driving circuit configured to supply a data signal to the plurality of data lines; and a gate driving circuit configured to supply a gate signal to the plurality of gate lines, wherein the channel width of each of thin film transistors connected to the same data line of the plurality of thin film transistors increases as the distance between a corresponding thin film transistor and the data driving circuit increases;

each of the plurality of thin film transistors has a gate electrode, a semiconductor layer, a source electrode, and a drain electrode; and wherein the channel width is determined by the size of the semiconductor layer.

18. The display device of claim 17, wherein a channel area defined where the source electrode and the drain electrode are spaced apart from each other has an I-shape.

19. The display device of claim 18, wherein the source electrode and the drain electrode are spaced apart from the gate electrode with a semiconductor layer therebetween; and the channel width increases as the size of the semiconductor layer increases.

20. The display device of claim 18, wherein an area of the gate electrode overlapping the drain electrode in each thin film transistor is substantially the same, and an area of the gate electrode overlapping the source electrode in each thin film transistor is substantially the same.

* * * * *